US011200949B2

(12) United States Patent
Miao et al.

(10) Patent No.: US 11,200,949 B2
(45) Date of Patent: Dec. 14, 2021

(54) MULTIPLIER AND OPERATION METHOD BASED ON 1T1R MEMORY

(71) Applicant: HUAZHONG UNIVERSITY OF SCIENCE AND TECHNOLOGY, Hubei (CN)

(72) Inventors: Xiangshui Miao, Hubei (CN); Yi Li, Hubei (CN); Xiaodi Huang, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 16/971,678

(22) PCT Filed: Jul. 12, 2019

(86) PCT No.: PCT/CN2019/095687
§ 371 (c)(1),
(2) Date: Aug. 20, 2020

(87) PCT Pub. No.: WO2020/103470
PCT Pub. Date: May 28, 2020

(65) Prior Publication Data
US 2021/0090646 A1 Mar. 25, 2021

(30) Foreign Application Priority Data
Nov. 19, 2018 (CN) .......................... 201811379932.6

(51) Int. Cl.
*G11C 11/00* (2006.01)
*G11C 13/00* (2006.01)
(Continued)

(52) U.S. Cl.
CPC ............ *G11C 13/004* (2013.01); *G06F 7/523* (2013.01); *G11C 7/1012* (2013.01);
(Continued)

(58) Field of Classification Search
CPC . G11C 13/004; G11C 7/1012; G11C 13/0026; G06F 7/523
(Continued)

(56) References Cited

U.S. PATENT DOCUMENTS

| 10,409,889 B2 * | 9/2019 | Fick ........................ G06F 17/16 |
| 2018/0046899 A1 * | 2/2018 | Degraeve ............ G06F 12/0207 |
| 2021/0065793 A1 * | 3/2021 | Ge ...................... G11C 13/0097 |

FOREIGN PATENT DOCUMENTS

| CN | 109634557 | 4/2019 |

OTHER PUBLICATIONS

"International Search Report (Form PCT/ISA/210) of PCT/CN2019/095687," dated Sep. 26, 2019, with English translation thereof, pp. 1-4.

\* cited by examiner

*Primary Examiner* — Vu A Le
(74) *Attorney, Agent, or Firm* — JCIP Global Inc.

(57) ABSTRACT

The invention discloses a multiplier and an operation method based on 1T1R memory. The multiplier includes: a 1T1R crossbar $A_1$, a 1T1R crossbar $A_2$, a 1T1R crossbar $A_3$, and a peripheral circuit. The 1T1R matrices are configured to realize operation and store result of it, and the peripheral circuit is configured to transfer data and control signals, thereby controlling the operation and storage process of the 1T1R matrices. An operation circuit is configured to respectively achieve NOR Boolean logic operations, two-bit binary multipliers, and optimization. The operation method corresponding to the operation circuit respectively completes the corresponding calculation and storage process by controlling an initialization resistance state of 1T1R devices, the size of a word line input signal, the size of a bit line input signal, and the size of a source line input signal.

12 Claims, 6 Drawing Sheets

(51) Int. Cl.
*G06F 7/523* (2006.01)
*G11C 7/10* (2006.01)

(52) U.S. Cl.
CPC ...... *G11C 13/0026* (2013.01); *G11C 13/0028* (2013.01); *G11C 13/0069* (2013.01)

(58) Field of Classification Search
USPC ........................................................ 365/148
See application file for complete search history.

(a)

$P0 = \overline{\overline{(a_1+b_1)} + \overline{(a_0+b_0)}}$ $P1 = \overline{\overline{\overline{(a_1+\overline{b_1})} + \overline{(\overline{a_0}+b_0)}}}$ $P2 = \overline{\overline{\overline{(a_0+\overline{b_1})} + \overline{(\overline{a_1}+b_0)}} + \overline{\overline{(a_1+\overline{b_0})} + \overline{(\overline{a_0}+b_1)}}}$ $P3 = \overline{\overline{(\overline{a_1}+\overline{b_1})}}$ (b)

MULTIPLIER AND OPERATION METHOD BASED ON 1T1R MEMORY

CROSS-REFERENCE TO RELATED APPLICATION

This application is a 371 of international application of PCT application serial no. PCT/CN2019/095687, filed on Jul. 12, 2019, which claims the priority benefit of China application no. 201811379932.6, filed on Nov. 19, 2018. The entirety of each of the above mentioned patent applications is hereby incorporated by reference herein and made a part of this specification.

BACKGROUND OF THE INVENTION

Field of the Invention

The invention belongs to a field of microelectronic devices, and more specifically, related to a multiplier and an operation method based on 1T1R memory.

Description of Related Art

The development of electronic information techniques has entered the "post-Moore" era. Due to the dual limitations of the manufacturing process and the physical mechanism, it is increasingly difficult to further reduce the size of semiconductor devices to improve the performance of integrated circuits. Instructions and data in traditional computer architectures are placed in the same memory, thus resulting in the issue of reduced CPU utilization (throughput rate), i.e., the von Neumann bottleneck. Research about memristor on nano device based on novel theories provides a new strategy for solving this issue.

Among the nano device based on the novel theories, memristors is a kind with significant prospects, which possesses advantages in aspects of high integration density, high read and write speed, low power consumption, and multi-valued computing potential, etc. For now, memristors have great application prospects in aspects such as non-volatile storage, logic operations, new computing/storage fusion architecture calculations, and new neuromorphic calculations, which provide a new physical foundation for the development of IT techniques. Combining existing and mature CMOS techniques and memristors may realize new computer architectures.

SUMMARY OF THE INVENTION

In view of the defects of the prior art, the invention provides a multiplication operation circuit and an operation method based on a 1T1R device. An object thereof is to realize non-volatile logic operation and realize more complicated calculation functions, and at the same time realize parallel calculation operations.

In order to achieve the above objects, according to the first aspect of the invention, a calculation matrix based on a 1T1R device is provided, including: a 1T1R crossbar and a peripheral circuit; the 1T1R crossbar is configured to implement an operation and store an operation result, and the peripheral circuit is configured to transfer data and control signals to control the operation and storage of the 1T1R matrix.

A 1T1R crossbar includes 1T1R devices arranged in the form of crossbar, word lines WL, bit lines BL, and source lines SL. A 1T1R device resistance state refers to a memristor resistance including: a high resistance state H and a low resistance state L. The 1T1R devices realize storage and processing data of 0/1 bp placing memristors in different resistance values. 1T1R devices located in the same column are connected to the same bit line BL and word line WL. 1T1R devices located in the same row are connected to the same source line SL. By applying different signals to the bit lines BL, the word lines WL, and the source lines SL, data transfer, different functional operations, and operation result storage are realized.

The 1T1R devices include: one transistor element and one memristor element. The transistor element structure includes: a substrate, a source, a drain, an insulating layer, and a gate, wherein the source is connected to the source lines SL, and the gate is connected to the word lines WL. The resistive element includes electrodes at both ends, wherein a positive electrode is connected to a drain of the transistor, and a negative electrode is connected to the bit lines BL. The memristor element is a sandwich stacking structure with variant resistance and non-volatile characteristics. That is, in an external signal excitation mode, the resistance state of the 1T1R devices may be changed from a high resistance state to a low resistance state, and in another external signal excitation mode, the resistance state of the 1T1R devices may be changed from the low resistance state to the high resistance state.

With reference to the first aspect of the invention, in a first embodiment of the first aspect of the invention, a resistive element of 1T1R devices is a resistive random-access memory RRAM. The resistive random-access memory RRAM includes: a top electrode, a functional layer, and a bottom electrode. The top electrode is connected to a bit line BL, and the bottom electrode is connected to a drain of transistor.

The peripheral circuit includes: a data transfer controller, a word line decoder, a source line decoder, a bit line decoder, a word line multiplexer, a bit line multiplexer, a source line multiplexer, and a timer controller;

the data transfer controller is formed by a data register, a data reading circuit, a data writing circuit, and a unit addressing circuit, and the data transfer controller has a data registration terminal $D_{in}$, an output terminal $D_{out}$, an address input terminal Address, a word line output terminal, a bit line output terminal, and a source line output terminal; the input terminal $D_{in}$ of the data transfer controller is configured to input a calculation data, the output terminal $D_{out}$ is configured to output a calculation result, the address input terminal Address is configured to input an address information of a selected specific device, and the word line output terminal, the bit line output terminal, and the source line output terminal are configured to input address signals of word line, bit line, and source line and read and write signals generated by the read and write circuits; the data transfer controller generates a control signal and output it to a next stage or read a final calculation result according to data inputted and outputted, and the address information request;

an input terminal of the word line decoder is connected to a word line output terminal of the data transfer controller, and an output terminal of the word line decoder is connected to a word line multiplexer input terminal; after the word line decoder decodes a control signal generated by the data transfer controller, a word line control signal is obtained, and the word line control signal is inputted to the word line multiplexer input terminal;

an input terminal of the bit line decoder is connected to a bit line output terminal of the data transfer controller, and an output terminal of the bit line decoder is connected to a bit line multiplexer input terminal; after the bit line decoder decodes a control signal generated by the data transfer controller, a bit line control signal is obtained, and the bit line control signal is inputted to the word line multiplexer input terminal;

an input terminal of the source line decoder is connected to the bit line output terminal of the data transfer controller, and an output terminal of the source line decoder is connected to a source line multiplexer input terminal; after the source line decoder decodes a control signal generated by the data transfer controller, a source line control signal is obtained, and the source line control signal is inputted to the word line multiplexer input terminal;

an output terminal of the word line multiplexer is connected to the word lines of the 1T1R crossbar, and the word line multiplexer applies the word line control signal to a word line according to a signal of the word line decoder.

An output terminal of the bit line multiplexer is connected to the bit lines of the 1T1R matrix, and the bit line multiplexer applies the bit line control signal to a bit line according to a signal of the bit line decoder.

An output terminal of the source line multiplexer is connected to the source lines of the 1T1R matrix, and the source line multiplexer applies the source line control signal to a source line according to a signal of the source line decoder.

The word line control signal, the bit line control signal, and the source line control signal are applied to the 1T1R matrix in common to realize a control of a resistance state of the 1T1R devices in the 1T1R crossbar;

an output terminal of the timing controller is connected to the word line, bit line, and source line multiplexers, and the timing controller generates a clock signal and an enable signal to control operation of the circuit.

Based on a calculation crossbar of the 1T1R devices, a voltage pulse is applied as an input signal to perform logic operations, and logic 0/1 is characterized with the final resistance state of the 1T1R devices. The result of the logic operations may be stored in the resistance state of the devices in a non-volatile manner. The resistance state may be read out by a read signal with a small current (generally in the nanoampere level) or a small voltage (generally 0.2 V or less). The resistance signal is erased by applying a voltage pulse with a certain amplitude and pulse width.

According to the second aspect of the invention, an operation circuit based on a calculation crossbar is provided and is configured to realize NOR Boolean logic, and specifically includes, calculating a NOR value c according to an input data a, data b: 2 1T1R devices $R_1$ and $R_2$ configured to calculate and store input data in1 and in2, a word line signal corresponding to $R_1$ is $V_{WL1}$, a bit line signal corresponding to $R_1$ is $V_{BL1}$, and a source line signal corresponding to $R_1$ is $V_{SL1}$; a word line signal corresponding to $R_2$ is $V_{WL1}$, a bit line signal corresponding to $R_2$ is $V_{BL1}$, and a source line signal corresponding to $R_2$ is $V_{SL2}$; 1 1T1R device $R_3$ configured to calculate and store an output data out, a word line signal corresponding to $R_3$ is $V_{WL1}$, a bit line signal corresponding to $R_3$ is $V_{BL1}$, and a source line signal corresponding to $R_3$ is $V_{SL3}$; the input signals are all controlled and applied by a peripheral circuit; a NOR structure out of in1 and in2 calculated by the 1T1R devices $R_1$, $R_2$, and $R_3$ is transferred to a data output circuit $D_{out}$ via a read module of the data transfer controller.

With reference to the second aspect of the invention, the invention also provides an operation method of an operation circuit based on a calculation matrix, including the following steps:

(S1-1) inputting logic signals $V_{WL1}=1$, $V_{SL1}=$in1, and $V_{BL1}=\overline{in_1}$ and writing an input logic signal in1 to the 1T1R device $R_1$;

(S1-2) inputting logic signals $V_{WL1}=1$, $V_{SL2}=$in2, and $V_{BL1}=\overline{in_2}$ and writing an input logic signal in2 to the 1T1R device $R_2$;

(S1-3) inputting logic signals $V_{WL1}=1$, $V_{SL3}=1$, and $V_{BL1}=0$ and setting a 1T1R device $R_3$ to low resistance;

(S1-4) inputting the logic signals $V_{WL1}=1$, $V_{SL1}=V_{SL2}=V_0$, and $V_{BL1}=0$ to calculate a NOR value out1 of input values in1 and in2 and writing it to the 1T1R device $R_3$;

(S1-5) reading the calculation result out1 stored in the 1T1R device $R_3$.

According to a third aspect of the invention, an operation circuit based on a calculation matrix is provided and configured to realize a two-bit binary multiplier, and specifically includes, according to input data $a_0a_1$ and $b_0b_1$ and calculated product values $s_{0\sim3}$: a 1T1R crossbar $A_1$, a 1T1R crossbar $A_2$, and a 1T1R crossbar $A_3$; the 1T1R crossbar $A_1$ includes 4 1T1R devices $R_{0A}$ to $R_{3A}$ respectively configured to store and calculate 4-bit initial input data $s_{0A\sim3A}=a_0a_1b_0b_1$, word line control signals corresponding to $R_{0A}$ to $R_{3A}$ are $V_{WL0A}$ to $V_{WL3A}$, a bit line control signal corresponding to $R_{0A}$ to $R_{3A}$ is respectively $V_{BL0}$, and source line control signals corresponding to $R_{0A}$ to $R_{3A}$ are respectively $V_{SL0A}$ to $V_{SL3A}$; the 1T1R crossbar $A_2$ includes 15 1T1R devices $R_{0\sim14}*$ respectively configured to store intermediate calculation results $s_{0\sim14}*$, word line control signals corresponding to $R_{0\sim14}*$ are $V_{WL0\sim WL14}*$, a bit line control signal corresponding to $R_{0\sim14}*$ is $V_{BL0}$, and source line control signals corresponding to $R_{0\sim14}*$ are $V_{SL0\sim SL14}*$; the 1T1R crossbar $A_3$ includes 4 1T1R devices $R_{0B}$ to $R_{3B}$ configured to calculate and store the multiplication operation results $s_{0\sim3}$, word line control signals corresponding to $R_{0B}$ to $R_{3B}$ are $V_{WL0B}$ to $V_{WL3B}$, a bit line control signal corresponding to $R_{0B}$ to $R_{3B}$ is $V_{BL0}$, and source line control signals corresponding to $R_{0B}$ to $R_{3B}$ are $V_{SL0B}$ to $V_{SL3B}$; the input signals are all controlled and applied by a peripheral circuit; and the intermediate data $s_{0\sim14}*$ and the calculation results $s_{0\sim3}$ obtained by calculating the 1T1R matrices $A_1$, $A_2$, $A_3$ realize reading and outputting data through a transfer controller.

With reference to the third aspect of the invention, the invention also provides an operation method of an operation circuit based on a calculation matrix, including the following steps:

(S2-1) inputting logic signals $V_{WL0A}*=1$, $V_{SL0A}=a_0$, and $V_{BL0}=\overline{a_0}$, writing the operation data $a_0$ inputted into $R_{0A}$ of the 1T1R crossbar $A_1$; inputting logic signals $V_{WL1A}=1$, $V_{SL1A}=a_1$, and $V_{BL0}=\overline{a_1}$ and writing the operation data $a_1$ inputted into $R_{1A}$ of the 1T1R crossbar $A_1$; inputting logic signals $V_{WL2A}*=1$, $V_{SL2A}=b_0$, and $V_{BL0}=\overline{b_0}$ and writing the operation data $b_0$ inputted into $R_{2A}$ of the 1T1R crossbar $A_1$; inputting logic signals $V_{WL3A}=1$, $V_{SL3A}=b_1$, and $V_{BL0}=\overline{b_1}$ and writing the operation data $b_1$ inputted into $R_{3A}$ of the 1T1R crossbar $A_1$;

(S2-2) inputting logic signals $V_{WL12}*=1$, $V_{SL12}*=0$, and $V_{BL0}=1$ and setting the 1T1R device $R_{12}*$ in high resistance, that is, $S_{12}*=0$; inputting logic signals $V_{WL0A\sim3A}=1$, $V_{WL0\sim3}*=1$, $V_{SL0A\sim3A}=V_0$, $V_{SL12}*=V_0$, $V_{SL0\sim3}*=0$, and $V_{WL12}{}^*=1$ respectively, and calculating NOT values $s_0{}^*=\overline{a_0}$, $s_1{}^*=\overline{a_1}$, $s_2{}^*=\overline{b_0}$, $s_3{}^*=\overline{b_1}$ of the input data $a_0a_1b_0b_1$ and storing them in the 1T1R devices $R_{0-3}{}^*$ of the 1T1R crossbar $A_2$ respectively;

(S2-3) inputting logic signals $V_{WL0}{}^*=1$, $V_{WL2}{}^*=1$, $V_{WL4}{}^*=1$, $V_{SL0}{}^*=V_0$, $V_{SL2}{}^*=V_0$, and $V_{SL4}{}^*=0$ to calculate a NOR value $$s_4^* = \overline{\overline{a_0} + \overline{b_0}} \text{ of } \overline{a_0}\overline{b_0}$$

in the 1T1R devices $R_0{}^*$ and $R_2{}^*$ of the 1T1R crossbar $A_2$ and storing it in the 1T1R device $R_4{}^*$ of the 1T1R crossbar $A_2$;

(S2-4) inputting logic signals $V_{WL0}{}^*=1$, $V_{WL3}{}^*=1$, $V_{WL5}{}^*=1$, $V_{SL0}{}^*=V_0$, $V_{SL3}{}^*=V_0$, and $V_{SL5}{}^*=0$ to calculate a NOR value $$s_5^* = \overline{\overline{a_0} + \overline{b_1}}$$

of $\overline{a_0}\,\overline{b_1}$ in the 1T1R devices $R_0{}^*$ and $R_3{}^*$ of the 1T1R crossbar $A_2$ and storing it in the 1T1R device $R_5{}^*$ of the 1T1R crossbar $A_2$;

(S2-5) inputting logic signals $V_{WL1}{}^*=1$, $V_{WL2}{}^*=1$, $V_{WL6}{}^*=1$, $V_{SL1}{}^*=V_0$, $V_{SL2}{}^*=V_0$, and $V_{SL6}{}^*=0$ to calculate a NOR value $$s_6^* = \overline{\overline{a_1} + \overline{b_0}}$$

of $\overline{a_1}\,\overline{b_0}$ in the 1T1R devices $R_1{}^*$ and $R_2{}^*$ of the 1T1R crossbar $A_2$ and storing it in the 1T1R device $R_6{}^*$ of the 1T1R crossbar $A_2$;

(S2-6) inputting logic signals $V_{WL1}{}^*=1$, $V_{WL3}{}^*=1$, $V_{WL7}{}^*=1$, $V_{SL1}{}^*=V_0$, $V_{SL3}{}^*=V_0$, and $V_{SL7}{}^*=0$ to calculate a NOR value $$s_7^* = \overline{\overline{a_1} + \overline{b_1}}$$

of $\overline{a_1}\,\overline{b_1}$ in the 1T1R devices $R_1{}^*$ and $R_3{}^*$ of the 1T1R crossbar $A_2$ and storing it in the 1T1R device $R_7{}^*$ of the 1T1R crossbar $A_2$;

(S2-7) inputting logic signals $V_{WL4}{}^*=1$, $V_{WLOB}=1$, $V_{WL8}{}^*=1$, $V_{SL4}{}^*=V_0$, $V_{SLOB}=V_0$, and $V_{SL8}{}^*=0$ to calculate a NOT value $s_8{}^*=\overline{\overline{a_0}+\overline{b_0}}$ of data $$\overline{\overline{a_0} + \overline{b_0}}$$

in the 1T1R device $R_4{}^*$ of the 1T1R crossbar $A_2$ and storing it in the 1T1R device $R_8{}^*$ of the 1T1R crossbar $A_2$;

(S2-8) inputting logic signals $V_{WL5}{}^*=1$, $V_{WLOB}=1$, $V_{WL9}{}^*=1$, $V_{SL5}{}^*=V_0$, $V_{SLOB}=V_0$, and $V_{SL9}{}^*=0$ to calculate a NOT value $s_9{}^*=\overline{\overline{a_0}+\overline{b_1}}$ of data $$\overline{\overline{a_0} + \overline{b_1}}$$

in the 1T1R device $R_5{}^*$ of the 1T1R crossbar $A_2$ and storing it in the 1T1R device $R_9{}^*$ of the 1T1R crossbar $A_2$;

(S2-9) inputting logic signals $V_{WL6}{}^*=1$, $V_{WLOB}=1$, $V_{WL10}{}^*=1$, $V_{SL6}{}^*=V_0$, $V_{SLOB}=V_0$, and $V_{SL10}{}^*=0$ to calculate a NOT value $s_{10}{}^*=\overline{\overline{a_1}+\overline{b_0}}$ of data $$\overline{\overline{a_1} + \overline{b_0}}$$

in the 1T1R device $R_6{}^*$ the 1T1R crossbar $A_2$ and storing it in the 1T1R device $R_{10}{}^*$ of the 1T1R crossbar $A_2$;

(S2-10) inputting logic signals $V_{WL7}{}^*=1$, $V_{WLOB}=1$, $V_{WL11}{}^*=1$, $V_{SL7}{}^*=V_0$, $V_{SLOB}=V_0$, and $V_{SL11}{}^*=0$ to calculate a NOT value $s_{11}{}^*=\overline{\overline{a_1}+\overline{b_1}}$ of data $$\overline{\overline{a_1} + \overline{b_1}}$$

in the 1T1R device $R_7{}^*$ of the 1T1R crossbar $A_2$ and storing it in the 1T1R device $R_{11}{}^*$ of the 1T1R crossbar $A_2$;

(S2-11) inputting logic signals $V_{WL8}{}^*=1$, $V_{WL11}{}^*=1$, $V_{WLOB}=1$, $V_{SL8}{}^*=V_0$, $V_{SL8}{}^*=V_0$, $V_{SLOB}=V_0$, and $V_{SLOB}=0$ to calculate a NOR value of data $\overline{a_0}+\overline{b_0}$ and $\overline{a_1}+\overline{b_1}$ 1T1R devices $R_8{}^*$ and $R_{11}{}^*$ of the 1T1R crossbar $A_2$ to obtain a first bit $$P_0 = s_0 = \overline{(\overline{a_0} + \overline{b_0}) + (\overline{a_1} + \overline{b_1})}$$

of a two-bit multiplication result and storing it in the 1T1R device $R_{0B}$ of a 1T1R crossbar $A_3$;

(S2-12) inputting logic signals $V_{WL11}{}^*=1$, $V_{WL8}{}^*=1$, $V_{WL1B}=1$, $V_{SL11}{}^*=V_0$, $V_{SL8}{}^*=V_0$, and $V_{SL1B}=0$ to calculate a NOR value of data $$\overline{\overline{a_1} + \overline{b_1}}$$

and $\overline{a_0}+\overline{b_0}$ in the 1T1R device $R_8{}^*$ and $R_{11}{}^*$ of the 1T1R crossbar $A_2$ to obtain a second bit $$P_1 = s_0 = \overline{(\overline{a_0} + \overline{b_0}) + (\overline{a_1} + \overline{b_1})}$$

of the two-bit multiplication result and storing it in the 1T1R device $R_{1B}$ of the 1T1R crossbar $A_3$ respectively;

(S2-13) inputting logic signals $V_{WL5}{}^*=1$, $V_{WL10}{}^*=1$, $V_{WL13}{}^*=1$, $V_{SL5}{}^*=V_0$, $V_{SL10}{}^*=V_0$, and $V_{SL13}{}^*=0$ to calculate a NOR value $$s_{13}^* = \overline{(\overline{a_1} + \overline{b_0}) + (\overline{a_0} + \overline{b_1})}$$

of data $$\overline{\overline{a_0} + \overline{b_1}}$$

and $\overline{a_1}+\overline{b_0}$ in the 1T1R devices $R_5{}^*$ and $R_{10}{}^*$ of the 1T1R crossbar $A_2$ and storing it in the 1T1R device $R_{13}{}^*$ of the 1T1R crossbar $A_2$ respectively;

inputting logic signals $V_{WL6}^*=1$, $V_{WL9}^*=1$, $V_{WL14}^*=1$, $V_{SL6}^*=V_0$, $V_{SL9}^*=V_0$, and $V_{SL14}^*=0$ to calculate a NOR value $$s_{14}^* = \overline{(\overline{a_0} + \overline{b_1}) + (\overline{a_1} + \overline{b_0})}$$

of data $$\overline{a_1} + \overline{b_0}$$

and $\overline{a_0}+\overline{b_1}$ in the 1T1R devices and $R_6^*$ and $R_9^*$ of the 1T1R crossbar $A_2$ and storing it in the 1T1R device $R_{14}^*$ of the 1T1R crossbar $A_2$ respectively; inputting logic signals $V_{WL15}^*=1$, $V_{WL12}^*=1$, $V_{WL2B}=1$, $V_{SL13}^*=V_0$, $V_{SL14}^*=V_0$, and $V_{SL15}^*=0$ to calculate a NOR value $$s_{15}^* = \overline{(\overline{a_0} + \overline{b_1}) + (\overline{a_1} + \overline{b_0}) + (\overline{a_1} + \overline{b_0}) + (\overline{a_0} + \overline{b_1})}$$

of data $$s_{13}^* = \overline{(\overline{a_1} + \overline{b_0}) + (\overline{a_0} + \overline{b_1})} \text{ and } s_{14}^* = \overline{(\overline{a_0} + \overline{b_1}) + (\overline{a_1} + \overline{b_0})}$$

in the 1T1R devices $R_{13}^*$ and $R_{14}^*$ of the 1T1R crossbar $A_2$; inputting logic signals $V_{WL24}=1$, $V_{WL12}^*=1$, $V_{WL15}^*=1$, $V_{SL2B}=0$, $V_{SL12}^*=V_0$, and $V_{SL15}^*=V_0$ to obtain a third bit $$P_2 = s_0 = \overline{(\overline{a_0} + \overline{b_1}) + (\overline{a_1} + \overline{b_0}) + (\overline{a_1} + \overline{b_0}) + (\overline{a_0} + \overline{b_1})}$$

of the two-bit multiplication result and storing it in the 1T1R device $R_{2B}$ of the 1T1R crossbar $A_3$;

(S2-14) inputting logic signals $V_{WL3B}=1$, $V_{SL3B}=0$, and $V_{BL0}=1$ and setting the 1T1R device $R_{3B}$ of the 1T1R crossbar $A_3$ in low resistance, wherein the data $s_7^*$ in the 1T1R device $R_7^*$ of the 1T1R crossbar $A_2$ is a fourth bit of the two-bit multiplication result; inputting logic signals $V_{WL7}^*=V_{WL3B}=1$, $V_{SL7}^*=0$, and $V_{SL3B}=V_0$ so that the 1T1R device $R_1$ transfers the data $s_7^*$ to the 1T1R device $R_{3B}$ through a transfer operation to obtain a fourth bit $P_3=s_3$ of the two-bit multiplication result.

According to the fourth aspect of the invention, an operation circuit based on a calculation matrix is provided and configured to realize an optimized two-bit binary multiplier, and specifically includes, according to input data $a_0a_1$ and bobs and calculated product values $s_{0\sim3}$: a 1T1R crossbar $A_1$, a 1T1R crossbar $A_2$, and a 1T1R crossbar $A_3$; the 1T1R crossbar $A_1$ includes 2 1T1R devices $R_{0A}$ to $R_{1A}$ respectively configured to store initial input data $s_{0A\sim3A}=a_0a_1b_0b_1$ or operation results $s_{0\sim1}$, word line control signals corresponding to $R_{0A}$ to $R_{3A}$ are $V_{WL0A}$ to $V_{WL1A}$, a bit line control signal corresponding to $R_{0A}$ to $R_{1A}$ is respectively $V_{BL0}$, and source line control signals corresponding to $R_{0A}$ to $R_{1A}$ are respectively $V_{SL0A}$ to $V_{SL1A}$; the 1T1R crossbar $A_2$ includes 8 1T1R devices $R_{0\sim7}^*$ respectively configured to store intermediate calculation results $s_{0\sim7}^*$, word line control signals corresponding to $R_{0\sim7}^*$ and $V_{WL0\sim7}^*$ a bit line control signal corresponding to $R_{0\sim7}^*$ is $V_{BL0}$, and source line control signals corresponding to $R_{0\sim7}^*$ are $V_{SL0\sim7}^*$, the 1T1R crossbar $A_3$ includes 2 1T1R devices $R_{0B}$ to $R_{1B}$ configured to calculate and store the addition operation results $s_{2\sim3}$, word line control signals corresponding to $R_{0B}$ to $R_{1B}$ are $V_{WL0B}$ to $V_{WL1B}$, a bit line control signal corresponding to $R_{0B}$ to $R_{1B}$ is $V_{BL0}$, and source line control signals corresponding to $R_{0B}$ to $R_{1B}$ are $V_{SL0B}$ to $V_{SL1B}$; the input signals are all controlled and applied by a peripheral circuit; and the intermediate data $s_{0\sim7}^*$ and the calculation results $s_{0\sim3}$ obtained by calculating the 1T1R matrices $A_1$, $A_2$, $A_3$ realize reading and outputting data through a data transfer controller.

With reference to the fourth aspect of the invention, the invention also provides an operation method of an operation circuit based on calculating matrices, including the following steps:

(S3-1) inputting logic signals $V_{WL0A}=1$, $V_{SL0A}=a_0$, and $V_{BL0}=\overline{a_0}$ and witting the operation data $a_0$ inputted into $R_{0A}$ of a 1T1R crossbar $A_1$, that is, $s_{0A}=a_0$; inputting logic signals $V_{WL1A}=1$, $V_{SL0A}=0$, and $V_{BL0}=1$ and setting $R_{1A}$ of the 1T1R crossbar $A_1$ in high resistance, that is, $s_{1A}=0$;

inputting logic signals $V_{WL0A}=1$, $V_{WL1A}=1$, $V_{WL0}^*=1$, $V_{SL0A}=V_0$, $V_{SL1A}=V_0$, and $V_{SL0}^*=0$ and obtaining a NOT value from $s_{0A}=a_0$ and store it in the 1T1R device $R_{0A}$ of the 1T1R crossbar $A_1$ in $R_0^*$ of the 1T1R crossbar $A_2$, that is, $s_0^*=\overline{a_0}$;

(S3-2) inputting logic signals $V_{WL0A}=1$, $V_{SL0A}=a_1$, and $V_{BL0}=\overline{a_1}$ and writing the operation data $a_1$ inputted into $R_{0A}$ of the 1T1R crossbar $A_1$, that is, $s_{0A}=a_1$; inputting logic signals $V_{WL0A}=1$, $V_{WL1A}=1$, $V_{WL1}^*=1$, $V_{SL0A}=V_0$, $V_{SL1A}=V_0$, and $V_{SL1}^*=0$ and obtaining a NOT value from $s_{0A}=a_1$ and store it in the 1T1R device $R_{0A}$ of the 1T1R crossbar $A_1$ in $R_1^*$ of the 1T1R crossbar $A_2$, that is, $s_0^*=\overline{a_1}$;

(S3-3) inputting logic signals $V_{WL0A}=1$, $V_{SL0A}=b_0$, and $V_{BL0}=\overline{b_0}$ and writing the operation data $b_0$ inputted into $R_{0A}$ of the 1T1R crossbar $A_1$, that is, $s_{0A}=b_0$; inputting logic signals $V_{WL0A}=1$, $V_{WL1A}=1$, $V_{WL2}^*=1$, $V_{SL0A}=V_0$, $V_{SL1A}=V_0$, and $V_{SL2}^*=0$ and obtaining a NOT value from $s_{0A}=b_0$ and store it in the 1T1R device $R_{0A}$ of the 1T1R crossbar $A_1$ in $R_2^*$ of the 1T1R crossbar $A_2$, that is, $s_0^*=\overline{b_0}$;

(S3-4) inputting logic signals $V_{WL0A}=1$, $V_{SL0A}=b_1$, and $V_{BL0}=\overline{b_1}$ and writing the operation data $b_1$ inputted into $R_{0A}$ of the 1T1R crossbar $A_1$, that is, $s_{0A}=b_1$; inputting logic signals $V_{WL0A}=1$, $V_{WL1A}=1$, $V_{SL0A}=V_0$, $V_{SL1A}=V_0$, and $V_{SL3}^*=0$ and obtaining a NOT value data $s_{0A}=b_1$ and store it in the 1T1R device $R_{0A}$ of the 1T1R crossbar $A_1$ in $R_3^*$ of the 1T1R crossbar $A_2$, that is, $s_0^*=\overline{b_1}$;

(S3-5) inputting logic signals $V_{WL0}^*=1$, $V_{WL2}^*=1$, $V_{WL4}^*=1$, $V_{SL0}^*=V_0$, $V_{SL2}^*=V_0$, and $V_{SL4}^*=0$ to calculate a NOR value $$s_4^* = \overline{\overline{a_0} + \overline{b_0}}$$

of $\overline{a_0}$ $\overline{b_0}$ in the 1T1R devices $R_0^*$ and $R_2^*$ of the 1T1R crossbar $A_2$ and storing it in a 1T1R device $R_4^*$ of the 1T1R crossbar $A_2$;

(S3-6) inputting logic signals $V_{WL0}^*=1$, $V_{WL3}^*=1$, $V_{WL4}^*=1$, $V_{SL0}^*=V_0$, $V_{SL3}^*=V_0$, and $V_{SL5}^*=0$ to calculate a NOR value $$s_5^* = \overline{\overline{a_0} + \overline{b_1}}$$

of $\overline{a_0}\,\overline{b_1}$ in1T1R the devices $R_0^*$ and $R_3^*$ of the 1T1R crossbar $A_2$ and storing it in a 1T1R device $R_5^*$ of the 1T1R crossbar $A_2$;

(S3-7) inputting logic signals $V_{WL1}^*=1$, $V_{WL2}^*=1$, $V_{WL0}^*=1$, $V_{SL1}^*=V_0$, $V_{SL2}^*=V_0$, and $V_{SL0}^*=0$ to calculate a NOR value $$s_0^* = \overline{\overline{a_1} + \overline{b_0}}$$

of $\overline{a_1}\,\overline{b_1}$ in the 1T1R devices $R_1^*$ and $R_2^*$ of the 1T1R crossbar $A_2$ and storing it in the 1T1R device $R_0^*$ of the 1T1R crossbar $A_2$;

(S3-8) inputting logic signals $V_{WL1}^*=1$, $V_{WL3}^*=1$, $V_{WL2}^*=1$, $V_{SL1}^*=V_0$, $V_{SL3}^*=V_0$, and $V_{SL2}^*=0$ to calculate a NOR value $$s_2^* = \overline{\overline{a_1} + \overline{b_1}}$$

of $\overline{a_1}\,\overline{b_1}$ in the 1T1R devices $R_1^*$ and $R_3^*$ of the 1T1R crossbar $A_2$ and storing it in the 1T1R device $R_2^*$ of the 1T1R crossbar $A_2$, which is a fourth bit $$P_3 = s_2^* = \overline{\overline{a_1} + \overline{b_1}}$$

of a two-bit binary multiplication result;

(S3-9) inputting logic signals $V_{WL0}^*=1$, $V_{WL1A}=0$, $V_{WL1}^*=1$, $V_{SL0}^*=V_0$, $V_{SL1A}=V_0$, and $V_{SL1}^*=0$ to calculate a NOT value $s_1^*=\overline{\overline{a_1}+\overline{b_0}}$ of $$\overline{\overline{a_1} + \overline{b_0}}$$

in the 1T1R device $R_1^*$ of the 1T1R crossbar $A_2$ and storing it in the 1T1R device $R_1^*$ of the 1T1R crossbar $A_2$;

(S3-10) inputting logic signals $V_{WL5}^*=1$, $V_{WL1A}=1$, $V_{WL3}^*=1$, $V_{SL5}^*=V_0$, $V_{SL1A}=V_0$, and $V_{SL3}^*=0$ to calculate a NOR values $s_3^*=\overline{\overline{a_0}+\overline{b_1}}$ of $$\overline{\overline{a_0} + \overline{b_1}}$$

in the 1T1R device $R_5^*$ of the 1T1R crossbar $A_2$ and storing it in the 1T1R device $R_3^*$ of the 1T1R crossbar $A_2$;

(S3-11) inputting logic signals $V_{WL5}^*=1$, $V_{WL1}^*=1$, $V_{WL0A}=1$, $V_{SL5}^*=V_0$, $V_{SL1}^*=V_0$, and $V_{SL0A}^*=0$ to calculate a NOR value $$s_0 = \overline{(\overline{a_1} + \overline{b_0}) + (\overline{a_0} + \overline{b_1})}$$

of data $$\overline{\overline{a_0} + \overline{b_1}}$$

and $\overline{a_1}+\overline{b_0}$ in the 1T1R devices $R_5^*$ and $R_1^*$ of the 1T1R crossbar $A_2$ and storing it in a 1T1R device $R_0$ of the 1T1R crossbar $A_1$ respectively;

(S3-12) inputting logic signals $V_{WL0}^*=1$, $V_{WL3}^*=1$, $V_{WL1A}=1$, $V_{SL0}^*=V_0$, $V_{SL3}^*=V_0$, and $V_{SL1A}^*=0$ to calculate a NOR value $$s_1 = \overline{(\overline{a_0} + \overline{b_1}) + (\overline{a_1} + \overline{b_0})}$$

of data $$\overline{\overline{a_1} + \overline{b_0}}$$

and $\overline{a_0}+\overline{b_0}$ in the 1T1R devices $R_0^*$ and $R_3^*$ of the 1T1R crossbar $A_2$ and storing it in a 1T1R device $R_0$ of the 1T1R crossbar $A_1$ respectively;

(S3-13) inputting logic signals $V_{WL0}^*=1$, $V_{SL0}^*=0$, and $V_{BL0}=1$ and setting $R_0^*$ of the 1T1R crossbar $A_2$ in high resistance, that is, $s_0^*=0$; inputting logic signals $V_{WL0A}=1$, $V_{WL1A}=1$, $V_{WL1}^*=1$, $V_{SL0A}=V_0$, $V_{SL1A}=V_0$, and $V_{SL1}^*=0$ to calculate a NOR value $$s_1^* = \overline{(\overline{a_0} + \overline{b_1}) + (\overline{a_1} + \overline{b_0}) + (\overline{a_1} + \overline{b_0}) + (\overline{a_0} + \overline{b_1})}$$

of data $$s_0 = \overline{(\overline{a_1} + \overline{b_0}) + (\overline{a_0} + \overline{b_1})} \text{ and } s_1 = \overline{(\overline{a_0} + \overline{b_1}) + (\overline{a_1} + \overline{b_0})}$$

in the 1T1R devices $R_0$ and $R_1$ of the 1T1R crossbar $A_1$; inputting logic signals $V_{WL0A}=1$, $V_{WL0}^*=1$, $V_{WL1}^*=1$, $V_{SL0A}=V_0$, and $V_{SL0}^*=0$ to calculate a third bit $$P_2 = s_0 = \overline{(\overline{a_0} + \overline{b_1}) + (\overline{a_1} + \overline{b_0}) + (\overline{a_1} + \overline{b_0}) + (\overline{a_0} + \overline{b_1})}$$

of a two-bit multiplication result and storing it in the 1T1R device $R_0$ of the 1T1R crossbar $A_1$ respectively;

(S3-14) inputting logic signals $V_{WL0}^*=1$, $V_{WL1}^*=1$, $V_{WL2}^*=1$, $V_{SL0}=V_0$, $V_{SL1}^*=0$, and $V_{SL2}^*=V_0$ to calculate a NOT value $s_1^*=\overline{\overline{a_1}+\overline{b_1}}$ of $$\overline{\overline{a_1} + \overline{b_1}}$$

in the 1T1R device of $R_2^*$ 1T1R crossbar $A_2$ and storing it in the 1T1R device $R_1^*$ of the 1T1R crossbar $A_2$;

(S3-15) inputting logic signals $V_{WL0}^*=1$, $V_{WL3}^*=1$, $V_{WL4^*}=1$, $V_{SL0}=V_0$, $V_{SL3}^*=0$, and $V_{SL4}^*=V_0$ to calculate a NOT value $s_3^*=\overline{\overline{a_0}+\overline{b_0}}$ of $$\overline{\overline{a_0} + \overline{b_0}}$$

in the 1T1R device $R_4^*$ of the 1T1R crossbar $A_2$ and storing it in the 1T1R device $R_3^*$ of the 1T1R crossbar $A_2$;

(S3-16) inputting logic signals $V_{WL1}*=1$, $V_{WL3}*=1$, $V_{WL1A}=1$, $V_{SL1}*=V_0$, $V_{SL3}*=0$, and $V_{SL1A}=V_0$ to obtain $$\overline{(\overline{a_1}+\overline{b_1})+(\overline{\overline{a_0}+\overline{b_0}})}$$

of a first bit $P_0=s_1$ of the two-bit multiplication result in the 1T1R devices $R_1*$ and $R_3*$ of the 1T1R crossbar $A_2$ and storing it in the 1T1R device $R_1$ of the 1T1R crossbar $A_1$;

(S3-17) inputting logic signals $V_{WL0}*=1$, $V_{WL2}*=1$, $V_{WL3}*=1$, $V_{SL0}*=0$, $V_{SL2}*=V_0$, and $V_{SL3}*=V_0$ to obtain $$\overline{(\overline{a_1}+\overline{b_1})+(\overline{\overline{a_0}+\overline{b_0}})}$$

of a second bit $P_1=s_1$ of the two-bit multiplication result in the 1T1R devices $R_2*$ and $R_3*$ of the 1T1R crossbar $A_2$ and storing it in the 1T1R device $R_0*$ of the 1T1R crossbar $A_2$;

According to the fifth aspect of the invention, an operation circuit based on a calculation matrix is provided and is configured for a multiple parallel two-bit binary multiplier, which calculates product values $s_{00}s_{10}s_{20}s_{30}$ to $s_{0(n-1)}s_{1(n-1)}s_{2(n-1)}s_{3(n-1)}$ according to input data $a_{00}a_{10}b_{00}b_{10}$ to $a_{0(n-1)}a_{1(n-1)}b_{0(n-1)}b_{1(n-1)}$, wherein n represents a number of modules, and the operation circuit comprising: n 1T1R matrices $A_0$ to $A_{(n-1)}$, n 1T1R matrices $B_0$ to $B_{(n-1)}$, and n 1T1R matrices $C_0$ to $C_{(n-1)}$; each of the n 1T1R matrices $A_0$ to $A_{(n-1)}$ includes 4 1T1R devices $R_{0A}$ to $R_{3A}$, respectively configured to store and calculate 4-bit initial input data $s_{0A\sim 3A}$, word line control signals corresponding to $R_{0A}$ to $R_{3A}$ are $V_{WL0A}$ to $V_{WL3A}$, a bit line control signal corresponding to $R_{0A}$ to $R_{3A}$ is respectively $V_{BL0x}$, and source line control signals corresponding to $R_{0A}$ to $R_{3A}$ are respectively $V_{SL0A}$ to $V_{SL3A}$; each of the n 1T1R matrices $B_0$ to $B_{(n-1)}$ includes 16 1T1R devices $R_{0\sim 15}*$ respectively configured to store intermediate calculation results $s_{0\sim 15}*$, word line control signals corresponding to $R_{0\sim 15}*$ are $V_{WL0\sim 15}*$, a bit line control signal corresponding to $R_{0\sim 15}*$ is $V_{BL0x}$, and source line control signals corresponding to $R_{0\sim 15}*$ are $V_{SL0\sim 15}*$; each of the n 1T1R matrices $C_0$ to $C_{(n-1)}$ includes 4 1T1R devices $R_{0C}$ to $R_{3C}$ configured to calculate and store addition operation results $s_{0\sim 3}$, word line control signals corresponding to $R_{0C}$ to $R_{3C}$ are $V_{WL0C}$ to $V_{WL3C}$, a bit line control signal corresponding to $R_{0C}$ to $R_{3C}$ is $V_{BL0x}$, and source line control signals corresponding to $R_{0C}$ to $R_{3C}$ are $V_{SL0C}$ to $V_{SL3C}$; the input signals are all controlled and applied by a peripheral circuit; intermediate data $s_{0x\sim 5x}*$ and calculation results $s_{0x\sim 3x}$ obtained by calculating the 1T1R matrices A, B, and C realize reading and outputting data through a data transfer controller, wherein x represents an x-th module; at the same time, it is assured that the bit lines of each module are the same and the bit lines of different modules are different.

With reference to the fifth aspect of the invention, the invention also provides an operation method of an operation circuit based on a calculation matrix, specifically including the following steps:

(S4-1) inputting logic signals $V_{WL0Ax}=1$, $V_{SL0Ax}=a_{0x}$, and $V_{BL0}=\overline{a_{0x}}$ and writing the operation data $a_{0x}$ inputted into $R_{0Ax}$ of a 1T1R crossbar $A_1$; inputting logic signals $V_{WL1Ax}=1$, $V_{SL1Ax}=a_{1x}$, and $V_{BL0x}=\overline{a_{1x}}$ and writing the operation data $a_{1x}$ inputted into $R_{1Ax}$ of a 1T1R crossbar $A_x$; inputting logic signals $V_{WL2A}=1$, $V_{SL2A}=b_{0x}$, and $V_{BL0}=\overline{b_{0x}}$ and writing the operation data $b_{0x}$ inputted into $R_{2Ax}$ of the 1T1R crossbar $A_x$; inputting logic signals $V_{WL3Ax}=1$, $V_{SL3Ax}=b_{1x}$, and $V_{BL0}=\overline{b_{1x}}$ and writing the operation data $b_{1x}$ inputted into $R_{3Ax}$ of the 1T1R crossbar $A_x$;

(S4-2) inputting logic signals $V_{WL12x}*=1$, $V_{SL12x}*=0$, and $V_{BL0x}=1$ and setting a 1T1R device $R_{12x}*$ in high resistance, that is, $s_{12x}*=0$; inputting logic signals $V_{WL0Ax\sim 3Ax}*=1$, $V_{WL0x\sim 3x}*=1$, $V_{SL0Ax\sim 3Ax}*=V_0$, $V_{SL12x}*=V_0$, $V_{SL0x\sim 3x}*=0$, and $V_{WL12x}*=1$ respectively and calculating NOT value $s_{0x}*=\overline{a_{0x}}$, $s_{1x}*=\overline{a_{1x}}$, $s_{2x}*=\overline{b_{0x}}$, $s_{3x}*=\overline{b_{1x}}$ of an input data $a_{0x}a_{1x}b_{0x}b_{1x}$ and storing them in 1T1R device $R_{0x\sim 3x}*$ of a 1T1R crossbar $B_x$ respectively;

(S4-3) inputting logic signals $V_{WL0x}*=1$, $V_{WL2x}*=1$, $V_{WL4x}*=1$, $V_{SL0x}*=V_0$, $V_{SL2x}*=V_0$, and $V_{SL4x}*=0$ to calculate a NOR value $$s_{4x}^*=\overline{\overline{a_{0x}}+\overline{b_{0x}}} \text{ of } \overline{a_{0x}b_{0x}}$$

in the 1T1R devices $R_{0x}*$ and $R_{2x}*$ of the 1T1R crossbar $B_x$ and storing it in a 1T1R device $R_{4x}*$ of the 1T1R crossbar $B_x$;

(S4-4) inputting logic signals $V_{WL0x}*=1$, $V_{WL3x}*=1$, $V_{WL5x}*=1$, $V_{SL0x}*=V_0$, $V_{SL3x}*=V_0$, and $V_{SL5x}*=0$ to calculate a NOR value $$s_{5x}^*=\overline{\overline{a_{0x}}+\overline{b_{1x}}}$$

of $\overline{a_{0x}}$ and $\overline{b_{1x}}$ in the 1T1R devices $R_{0x}*$ and $R_{3x}*$ of the 1T1R crossbar $B_x$ and storing it in a 1T1R device $R_{5x}*$ of the 1T1R crossbar $B_x$;

(S4-5) inputting logic signals $V_{WL1x}*=1$, $V_{WL2x}*=1$, $V_{WL6x}*=1$, $V_{SL1x}*=V_0$, $V_{SL2x}*=V_0$, and $V_{SL6x}*=0$ to calculate a NOR value $$s_{6x}^*=\overline{\overline{a_{1x}}+\overline{b_{0x}}}$$

of $\overline{a_{1x}}$ and $\overline{b_{0x}}$ in the 1T1R devices $R_{1x}*$ and $R_{2x}*$ of the 1T1R crossbar $B_x$ and storing it in a 1T1R device $R_{6x}*$ of the 1T1R crossbar $B_x$;

(S4-6) inputting logic signals $V_{WL1x}*=1$, $V_{WL3x}*=1$, $V_{WL7x}*=1$, $V_{SL1x}*=V_0$, $V_{SL3x}*=V_0$, and $V_{SL7x}*=0$ to calculate a NOR value $$s_{7x}^*=\overline{\overline{a_{1x}}+\overline{b_{1x}}}$$

of $a_{1x}$ and $b_{1x}$ in the 1T1R devices $R_{1x}*$ and $R_{3x}*$ of the 1T1R crossbar $B_x$ and storing it in a 1T1R device $R_{7x}*$ of the 1T1R crossbar $B_x$;

(S4-7) inputting logic signals $V_{WL4x}*=1$, $V_{WL0Bx}=1$, $V_{WL8x}*=1$, $V_{WSL4x}*=V_0$, $V_{SL0Bx}=V_0$ and $V_{SL8x}*=0$ to calculate a NOT value $s_{8x}*=\overline{a_{0x}+b_{0x}}$ of data $$\overline{\overline{a_{0x}}+\overline{b_{0x}}}$$

in the 1T1R device $R_{4x}*$ of the 1T1R crossbar $B_x$ and storing it in a 1T1R device $R_{8x}*$ of the 1T1R crossbar $B_x$;

(S4-8) inputting logic signals $V_{WL5x}*=1$, $V_{WL0Bx}=1$, $V_{WL9x}*=1$, $V_{WSL5x}*=V_0$, $V_{SL0Bx}=V_0$ and $V_{SL9x}*=0$ to calculate a NOT value $s_{9x}*=\overline{a_{0x}+b_{1x}}$ of data $$\overline{\overline{a_{0x}} + \overline{b_{1x}}}$$

in the 1T1R device $R_{5x}^*$ of the 1T1R crossbar $B_x$ and storing it in a 1T1R device $R_{9x}^*$ of the 1T1R crossbar $B_x$;

(S4-9) inputting logic signals $V_{WL6x}^*=1$, $V_{WL0Bx}=1$, $V_{WL10x}^*=1$, $V_{WSL6x}^*=V_0$, $V_{SL0Bx}=V_0$ and $V_{SL10x}^*=0$ to calculate a NOT value $s_{10x}^*=\overline{\overline{a_{1x}}+\overline{b_{0x}}}$ of data $$\overline{\overline{a_{1x}} + \overline{b_{0x}}}$$

in the 1T1R device $R_{6x}^*$ of the 1T1R crossbar $B_x$ and storing it in a 1T1R device $R_{10x}^*$ of the 1T1R crossbar $B_x$;

(S4-10) inputting logic signals $V_{WL7x}^*=1$, $V_{WL0Bx}=1$, $V_{WL11x}^*=1$, $V_{WSL7x}^*=V_0$, $V_{SL0Bx}=V_0$ and $V_{SL11x}^*=0$ to calculate a NOT value $s_{11x}^*=\overline{\overline{a_{1x}}+\overline{b_{1x}}}$ of data $$\overline{\overline{a_{1x}} + \overline{b_{1x}}}$$

in the 1T1R device $R_{7x}^*$ of the 1T1R crossbar $B_x$ and storing it in a 1T1R device $R_{11x}^*$ of the 1T1R crossbar $B_x$;

(S4-11) inputting logic signals $V_{WL8x}^*=1$, $V_{WL11x}^*=1$, $V_{WL0Bx}=1$, $V_{WSL8x}^*=V_0$, $V_{SL11x}^*=0$, and $V_{SL0Bx}=V_0$ to calculate a NOR value of data $\overline{\overline{a_{0x}}+\overline{b_{0x}}}$ and $\overline{\overline{a_{1x}}+\overline{b_{1x}}}$ in the 1T1R devices $R_{8x}^*$ and $R_{11x}^*$ of the 1T1R crossbar $B_x$ to obtain a first bit $$P_{0x} = s_{0x} = \overline{(\overline{a_{0x}} + \overline{b_{0x}}) + (\overline{a_{1x}} + \overline{b_{1x}})}$$

of a two-bit multiplication result and storing it in a 1T1R device $R_{0Bx}$ of a 1T1R crossbar $C_x$;

(S4-12) inputting logic signals $V_{WL11x}^*=1$, $V_{WL8x}^*=1$, $V_{WL1Bx}=1$, $V_{WSL11x}^*=V_0$, $V_{SL8x}^*=0$, and $V_{SL1Bx}=V_0$ to calculate a NOR value of data $$\overline{\overline{a_{1x}} + \overline{b_{1x}}}$$

and $\overline{\overline{a_{0x}}+\overline{b_{0x}}}$ in the 1T1R devices $R_{8x}^*$ and $R_{11x}^*$ of the 1T1R crossbar $B_x$ to obtain a second bit $$P_{1x} = s_{0x} = \overline{(\overline{a_{0x}} + \overline{b_{0x}}x) + (\overline{a_{1x}} + \overline{b_{1x}})}$$

of a two-bit multiplication result and storing it in a 1T1R device $R_{1Bx}$ of a 1T1R crossbar $C_x$ respectively;

(S4-13) inputting logic signals $V_{WL5x}^*=1$, $V_{WL10x}^*=1$, $V_{WL13x}^*=1$, $V_{SL1x}^*=V_0$, $V_{SL7x}^*=V_0$, and $V_{SL13x}^*=0$ to calculate a NOR value $$s_{13}^* = \overline{(\overline{a_{1x}} + \overline{b_{0x}}) + (\overline{a_{0x}} + \overline{b_{1x}})}$$

of data $$\overline{\overline{a_{0x}} + \overline{b_{1x}}}$$

and $\overline{\overline{a_{1x}}+\overline{b_{0x}}}$ in the 1T1R devices $R_{5x}^*$ and $R_{10x}^*$ of the 1T1R crossbar $B_x$ and storing it in a 1T1R device $R_{13x}^*$ of the 1T1R crossbar $B_x$ respectively;

inputting logic signals $V_{WL6x}^*=1$, $V_{WL9x}^*=1$, $V_{WL14x}^*=1$, $V_{SL6x}^*=V_0$, $V_{SL9x}^*=V_0$, and $V_{SL14x}^*=0$ to calculate a NOR value $$s_{14x}^* = \overline{(\overline{a_{0x}} + \overline{b_{1x}}) + (\overline{a_{1x}} + \overline{b_{0x}})}$$

of data $$\overline{\overline{a_{1x}} + \overline{b_{0x}}}$$

and $\overline{\overline{a_{0x}}+\overline{b_{1x}}}$ in the 1T1R devices $R_{6x}^*$ and $R_{9x}^*$ of the 1T1R crossbar $B_x$ and storing it in a 1T1R device $R_{14x}^*$ of the 1T1R crossbar $B_x$ respectively; inputting logic signals $V_{WL15x}^*=1$, $V_{WL12x}^*=1$, $V_{WL2Bx}^*=1$, $V_{SL13x}^*=V_0$, $V_{SL14x}^*=V_0$, and $V_{SL15x}^*=0$ to calculate a NOR value $$s_{15x}^* = \overline{(\overline{a_{0x}} + \overline{b_{1x}}) + (\overline{a_{1x}} + \overline{b_{0x}}) + (\overline{a_{1x}} + \overline{b_{0x}}) + (\overline{a_{0x}} + \overline{b_{1x}})}$$

of data $$s_{13x}^* = \overline{(\overline{a_{1x}} + \overline{b_{0x}}) + (\overline{a_{0x}} + \overline{b_{1x}})} \text{ and } s_{14x}^* = \overline{(\overline{a_{0x}} + \overline{b_{1x}}) + (\overline{a_{1x}} + \overline{b_{0x}})}$$

in the 1T1R devices $R_{13x}^*$ and $R_{14x}^*$ of the 1T1R crossbar $B_x$; inputting logic signals $V_{WL2A}=1$, $V_{WL12x}^*=1$, $V_{WL15x}^*=1$, $V_{SL2B}=0$, $V_{SL12x}^*=V_0$, and $V_{SL15x}^*=V_0$ to obtain a third bit $$P_{x2} = s_{0x} = \overline{(\overline{a_{0x}} + \overline{b_{1x}}) + (\overline{a_{1x}} + \overline{b_{0x}}) + (\overline{a_{1x}} + \overline{b_{0x}}) + (\overline{a_{0x}} + \overline{b_{1x}})}$$

of the two-bit multiplication result and storing it in a 1T1R device $R_{2Bx}$ of the 1T1R crossbar $C_x$;

(S4-14) inputting logic signals $V_{WL3Bx}=1$, $V_{SL3Bx}=0$, and $V_{BL0X}=1$ and setting a 1T1R device $R_{3Bx}$ of the 1T1R crossbar $C_x$ in low resistance, wherein the data $s_{7x}^*$ in the 1T1R device $R_{7x}^*$ of the 1T1R crossbar $B_x$ is a fourth bit of the two-bit multiplication result; inputting logic signals $V_{WL7x}^*=V_{WL3Bx}=1$, $V_{SL7x}^*=0$, and $V_{SL3Bx}=V_0$ so that the 1T1R device $R_{7x}^*$ transfers the data $s_{7x}^*$ to the 1T1R device $R_{3Bx}$ through a transfer operation to obtain a fourth bit $P_{3x}=s_{3x}$ of the two-bit multiplication result.

The invention provides a calculation matrix structure based on 1T1R devices, and conceives the above technical solutions, provides a plurality of operation circuits and operation methods, may realize NOR Boolean logic, a two-bit binary multiplier, an optimized design thereof, and multiple parallel two-bit binary multiplier and other complex operations. The operation circuit is based on the calculation matrix based on 1T1R devices. While logic operations are performed, the calculation results may be directly stored in the 1T1R devices of the calculation matrix to realize the fusion of calculation and storage.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
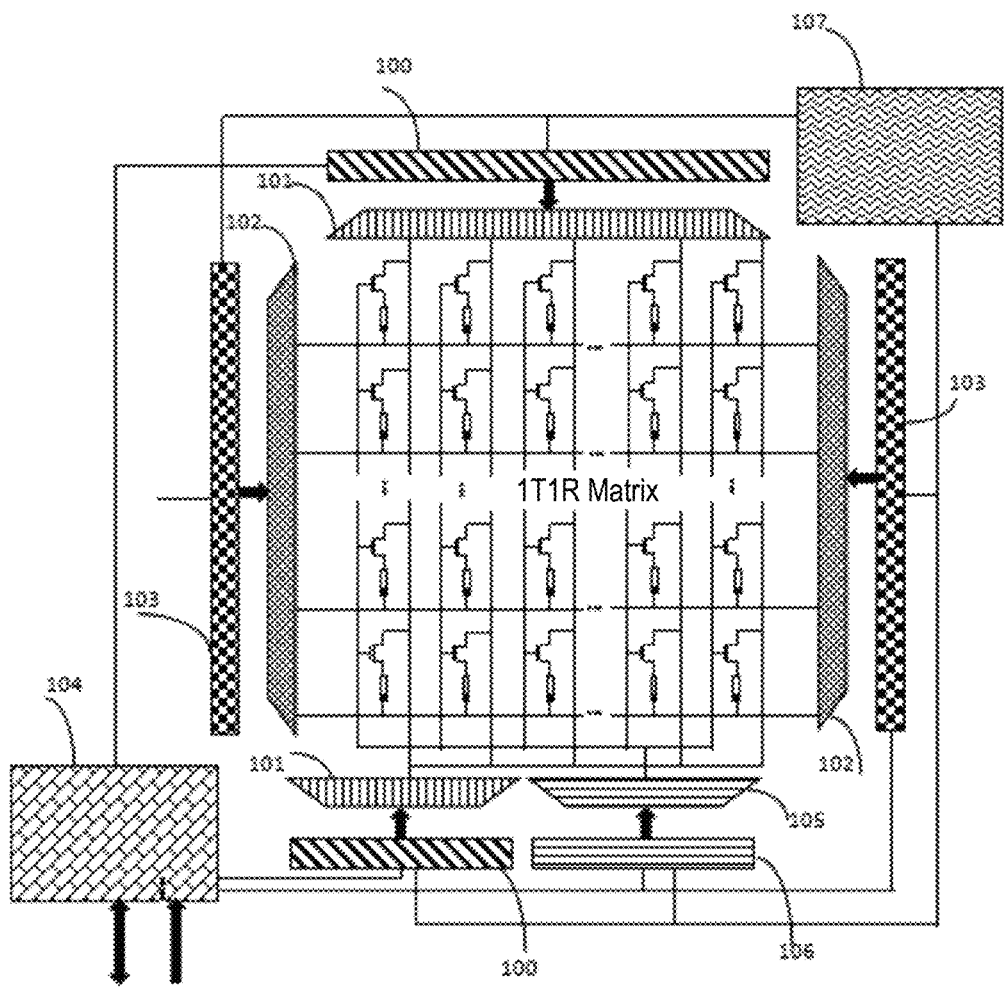
FIG. 1 is a diagram of a calculation matrix based on a 1T1R device provided by an embodiment of the invention.

In all of the figures, the same reference numerals are used to denote the same elements or structures, wherein: 100 is the source line decoder, 101 is the source line multiplexer, 102 is the word line multiplexer, 103 is the word line decoder, 104 is the data transfer controller, 105 is the bit line multiplexer, 106 is the bit line decoder, 107 is the timing controller, 200 is the bit line, 201 is the RRAM upper electrode, 202 is the RRAM functional layer, 203 is the RRAM lower electrode, 204 is the source line, 205 is the transistor gate, 206 is the transistor insulating layer, 207 is the transistor source, 208 is the transistor drain, and 209 is the transistor substrate.

DESCRIPTION OF THE EMBODIMENTS

In order to make the objects, technical solutions, and advantages of the invention clearer, the invention is further described in detail below with reference to the accompanying figures and embodiments. It should be understood that the specific embodiments described herein are only used to explain the invention, and are not intended to limit the invention.

In order to make the objects, technical solutions, and advantages of the invention clearer, the invention is further described in detail below with reference to the accompanying figures and embodiments. It should be understood that the specific embodiments described herein are only used to explain the invention, and are not intended to limit the invention. In addition, the technical features involved in each embodiment of the invention described below may be combined with each other as long as there is no conflict with each other.

A calculation matrix based on a 1T1R device provided by the invention as shown in FIG. 1 includes: a 1T1R crossbar and a peripheral circuit; the 1T1R crossbar is configured to implement an operation and store an operation result, and the peripheral circuit is configured to transfer data and control signals to control the operation and storage of the 1T1R crossbar.

Figure 2:
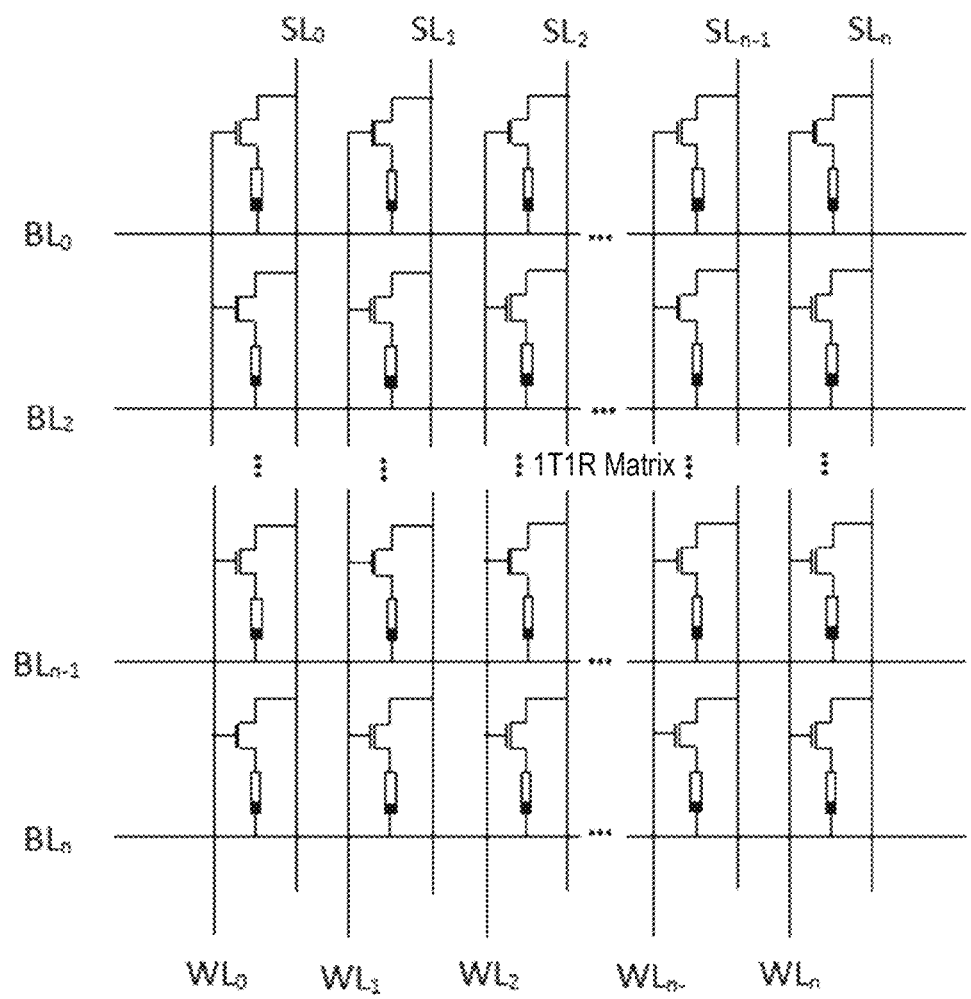
FIG. 2 is a diagram of a 1T1R crossbar in a calculation matrix provided by an embodiment of the invention.

A 1T1R array, as shown in FIG. 2, includes 1T1R devices, word lines WL, bit lines BL, and source lines SL arranged in an array. The 1T1R devices realize the storage and processing of information via different resistance states. 1T1R devices located in the same column are connected to the same bit line, and 1T1R devices located in the same row are connected to the same source line and word line. Different signals are applied to the word lines WL, the bit lines BL, and the source lines SL to realize different operations and store the operation result.

Figure 3:
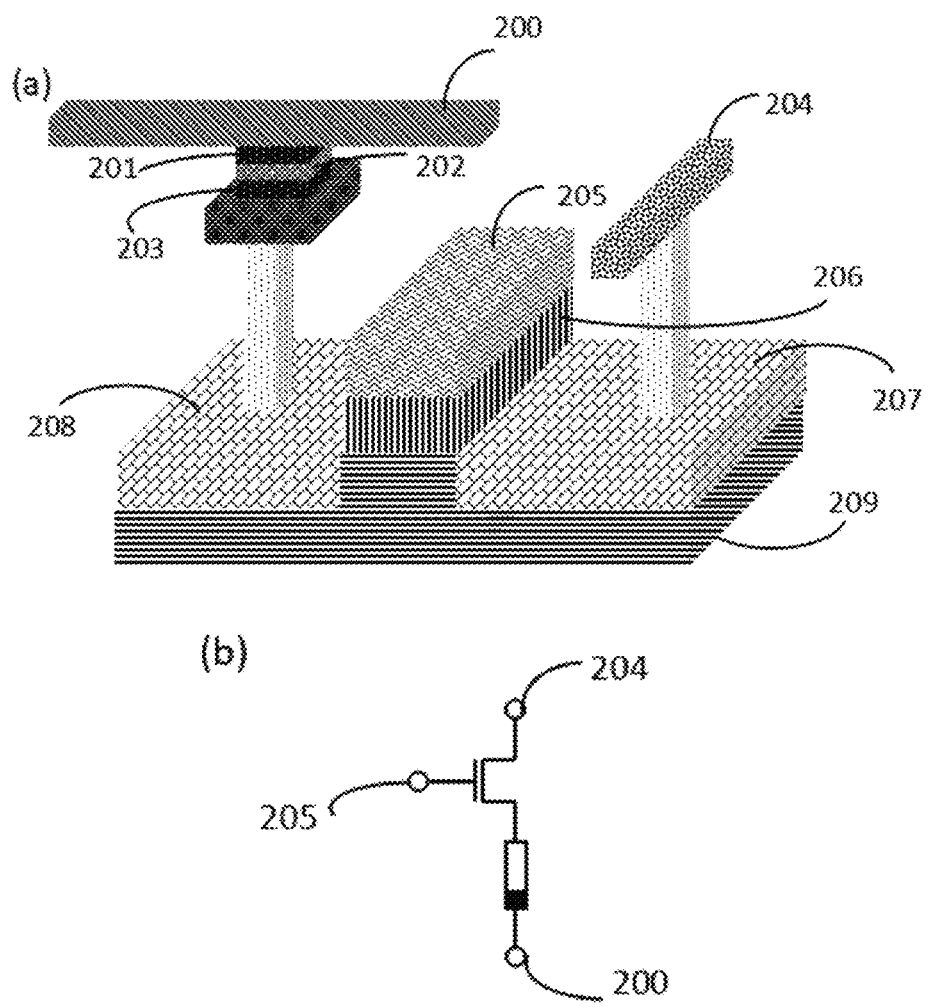
FIG. 3 is a diagram of a three-tier structure and a diagram of an equivalent circuit of a 1T1R device provided by an embodiment of the invention; (a) is a diagram of a three-tier structure of a 1T1R device; (b) is a diagram of an equivalent circuit of a 1T1R device.

The 1T1R devices, as shown in FIG. 3, include one transistor and one resistive element. The transistor includes: a substrate 309, a source 307, a drain 308, an insulating layer 306, and a gate 305. In the present embodiment, the resistive element is a resistive random-access memory RRAM, including: an upper electrode 201, a functional layer 202, and a lower electrode 203. A source 207 of the transistor is connected to a bit line 200, a gate 205 of the transistor is connected to the word line, the upper electrode 201 of the resistive random-access memory RRAM is connected to the bit line 200, and the lower electrode 203 of the resistive random-access memory RRAM is connected to a drain 208 of the transistor.

The resistance states of the 1T1R devices include: a high resistance state H and a low resistance state L; the resistance state of the 1T1R devices may undergo a reversible resistance state transition under the action of external signal excitation. That is, in an external signal excitation mode, the resistance state of the 1T1R devices may be changed from a high resistance state to a low resistance state, and in another external signal excitation mode, the resistance state of the 1T1R devices may be changed from the low resistance state to the high resistance state. Information storage and processing may be realized by using the two resistance states of the 1T1R devices.

As shown in FIG. 1, the peripheral circuit includes: a data transfer controller 104, a word line decoder 105, a source line decoder 100, a bit line decoder 103, a word line multiplexer 106, a bit line multiplexer 102, a source line multiplexer 101, and a timer controller 107, wherein:

the data transfer controller 104 is formed by a data register, a data reading circuit, a data writing circuit, and a unit addressing circuit, and the data transfer controller 104 has a data registration terminal $D_{in}$, an output terminal $D_{out}$, an address input terminal Address, a word line output terminal, a bit line output terminal, and a source line output terminal; the input terminal $D_{in}$ of the data transfer controller is configured to input a calculation data, the output terminal $D_{out}$ is configured to output a calculation result, the address input terminal Address of the state controller is configured to input an address information of a selected specific device, and the word line output terminal, the bit line output terminal, and the source line output terminal are configured to input address signals of word line, bit line, and source line and read and write signals generated by the read and write circuits; the data transfer controller generates a control signal to output it to a next stage or read a final calculation result according to input and output data and the address information;

an input terminal of the word line decoder 105 is connected to the word line output terminal of the data transfer controller, and an output terminal of the word line decoder is connected to a word line multiplexer input terminal; after the word line decoder decodes a control signal generated by the state controller, a word line control signal is obtained, and the word line control signal is inputted to the word line multiplexer input terminal;

an input terminal of the bit line decoder 103 is connected to the bit line output terminal of the data transfer controller, and an output terminal of the bit line decoder is connected to a bit line multiplexer input terminal; after the bit line decoder decodes a control signal generated by the state controller, a bit line control signal is obtained, and the bit line control signal is inputted to the word line multiplexer input terminal;

an input terminal of the source line decoder 100 is connected to the bit line output terminal of the data transfer controller, and an output terminal of the source line decoder is connected to a source line multiplexer input terminal; after the source line decoder decodes a control signal generated by the state controller, a source line control signal is obtained, and the source line control signal is inputted to the word line multiplexer input terminal;

an output terminal of the word line multiplexer 106 is connected to the word lines of the 1T1R crossbar, and the word line multiplexer applies the word line control signal to a gated specific word line according to a signal of the word line decoder.

An output terminal of the bit line multiplexer 102 is connected to the bit lines of the 1T1R crossbar, and the bit line multiplexer applies the bit line control signal to a gated specific bit line according to a signal of the bit line decoder.

An output terminal of the source line multiplexer 101 is connected to the source lines of the 1T1R crossbar, and the source line multiplexer applies the source line control signal to a gated specific source line according to a signal of the source line decoder.

The word line control signal, the bit line control signal, and the source line control signal are applied to the 1T1R crossbar in common to realize a control of a resistance state of the 1T1R devices in the 1T1R crossbar;

an output terminal of the timing controller 107 is connected to the word line, bit line, and source line multiplexers, and the timing controller generates a clock signal and an enable signal to control operation of the circuit.

The initialization resistance state, the word line input signals, the bit line input signals, and the source line input signals of the 1T1R devices are controlled to achieve non-basic Boolean logic operations, thus achieving 16 kinds of Boolean logic operations;

a logic signal $V_{WL}=1$ is inputted through the word lines, a logic signal $V_{SL}=V_{read}$ is inputted through the source lines, a logic signal $V_{BL}=0$ is inputted through the bit lines, and the logic signals stored on the 1T1R devices are read; wherein $V_{read}$ is a voltage pulse signal applied while reading the resistance state of the 1T1R devices.

Figure 4:
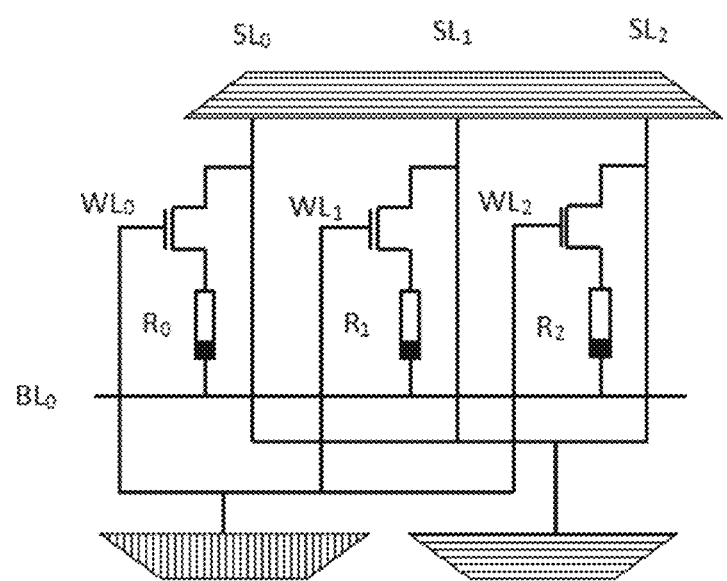
FIG. 4 is an equivalent circuit diagram of an operation circuit based on the NOR-logic of a calculation matrix provided by an embodiment of the invention.

FIG. 4 shows an operation circuit based on a calculation matrix provided by the invention and configured to realize basic NOR logic, and specifically includes, according to the calculation of an input data a, data b, or NOT value c: 2 1T1R devices $R_1$ and $R_2$ configured to calculate and store input data in1 and in2, a word line signal corresponding to $R_1$ is $V_{WL1}$, a bit line signal corresponding to $R_1$ is $V_{BL1}$, and a source line signal corresponding to $R_1$ is $V_{SL1}$; a word line signal corresponding to $R_2$ is $V_{WL1}$, a bit line signal corresponding to $R_2$ is $V_{BL1}$, and a source line signal corresponding to $R_2$ is $V_{SL2}$; 1 1T1R device $R_3$ configured to calculate and store an output data out, a word line signal corresponding to $R_3$ is $V_{WL1}$, a bit line signal corresponding to $R_3$ is $V_{BL1}$, and a source line signal corresponding to $R_3$ is $V_{SL3}$; the input signals are all controlled and applied by a peripheral circuit; a NOR structure out of in1 and in2 calculated by the 1T1R devices $R_1$, $R_2$, and $R_3$ is transferred to a data output circuit $D_{out}$ via a read module of the data transfer controller.

With reference to the operation circuit based on a calculation matrix shown in FIG. 4, the operation method provided by the invention includes the following steps:

(S1-1) inputting logic signals $V_{WL1}=1$, $V_{SL1}=\text{in1}$, and $V_{BL1}=\overline{\text{in}_1}$ and writing the input logic signal in1 to the 1T1R device $R_1$;

(S1-2) inputting logic signals $V_{WL1}=1$, $V_{SL2}=\text{in2}$, and $V_{BL1}=\overline{\text{in}_2}$ and writing the input logic signal in2 to the 1T1R device $R_2$;

(S1-3) inputting logic signals $V_{WL1}=1$, $V_{SL3}=1$, and $V_{BL1}=0$ and setting a 1T1R device $R_3$ to low resistance;

(S1-4) inputting logic signals $V_{WL1}=1$, $V_{SL1}=V_{SL2}=V_{SL1}=V_0$, and $V_{BL1}=0$ to calculate a NOR value out1 of input values in1 and in2 and writing it to the 1T1R device $R_3$;

(S1-5) reading the calculation result out1 stored in the 1T1R device $R_3$.

Figure 5:
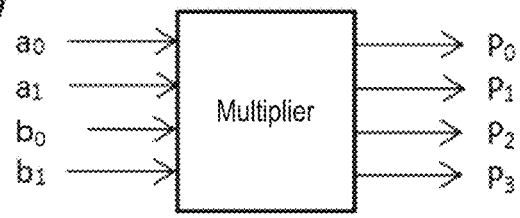
FIG. 5 is an equivalent circuit diagram of a two-bit binary multiplier operation circuit based on a calculation matrix provided by an embodiment of the invention; (a) is a circuit schematic diagram; (b) is an equivalent circuit diagram.
Figure 5:
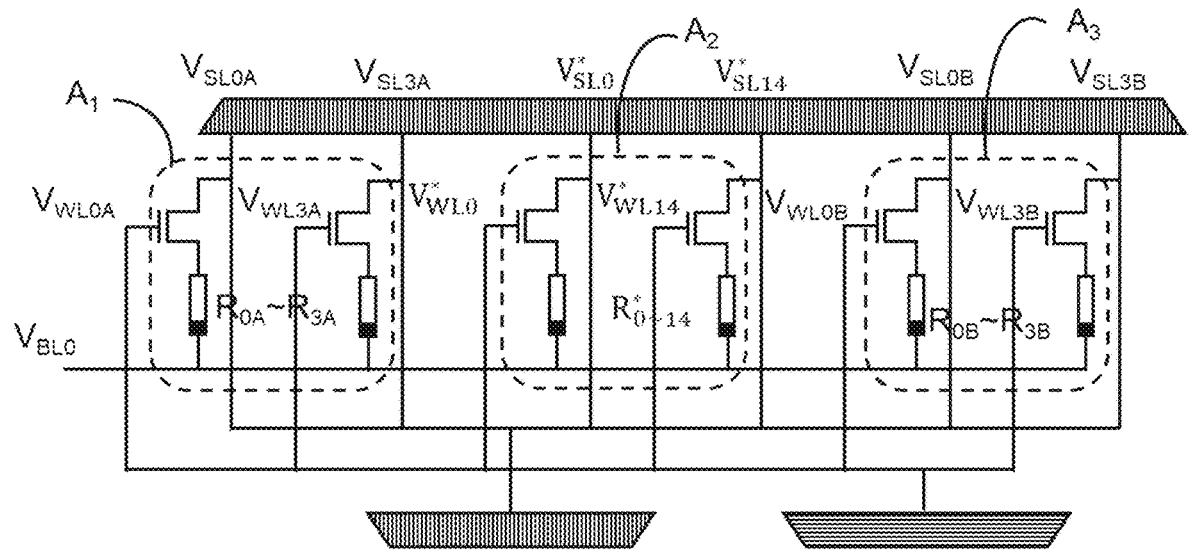

FIG. 5 shows an operation circuit based on a calculation matrix provided by the invention and configured to realize a two-bit binary multiplier, and specifically, calculating product values $s_{0\sim3}$ according to input data $a_0a_1$ and $b_0b_1$, the operation circuit includes: a 1T1R crossbar $A_1$, a 1T1R crossbar $A_2$, and a 1T1R crossbar $A_3$; the 1T1R crossbar $A_1$ includes 4 1T1R devices $R_{0A}$ to $R_{3A}$ respectively configured to store and calculate 4-bit initial input data $s_{0A\sim3A}=a_0a_1b_0b_1$, word line control signals corresponding to $R_{0A}$ to $R_{3A}$ are $V_{WL0A}$ to $V_{WL3A}$, a bit line control signal corresponding to $R_{0A}$ to $R_{3A}$ is respectively $V_{BL0}$, and source line control signals corresponding to $R_{0A}$ to $R_{3A}$ are respectively $V_{SL0A}$ to $V_{SL3A}$; the 1T1R crossbar $A_2$ includes 15 1T1R devices $R_{0\sim14}*$ respectively configured to store intermediate calculation results $s_{0\sim14}*$, word line control signals corresponding to $R_{0\sim14}*$ are $V_{WL0\sim14}*$, a bit line control signal corresponding to $R_{0\sim14}*$ is $V_{BL0}$, and source line control signal corresponding to $R_{0\sim14}*$ are $V_{SL0\sim14}*$, the 1T1R crossbar $A_3$ includes 4 1T1R devices $R_{0B}$ to $R_{3B}$ configured to calculate and store the addition operation results $s_{0\sim3}$, word line control signals corresponding to $R_{0B}$ to $R_{3B}$ are $V_{WL0B}$ to $V_{WL3B}$, a bit line control signal corresponding to $R_{0B}$ to $R_{3B}$ is $V_{BL0}$, and source line control signals corresponding to $R_{0B}$ to $R_{3B}$ are $V_{SL0B}$ to $V_{SL3B}$; the input signals are all controlled and applied by a peripheral circuit; and the intermediate data $s_{0\sim14}*$ and the calculation results $s_{0\sim3}$ calculated by the 1T1R matrices $A_1$, $A_2$, $A_3$ realize reading outputting data through the data transfer controller.

With reference to the operation circuit based on a calculation matrix shown in FIG. 5, the operation method provided by the invention includes the following steps:

(S2-2) inputting logic signals $V_{WL12}*=1$, $V_{SL12}*=0$, and $V_{BL0}=1$ and setting the 1T1R device $R_{12}*$ in high resistance, that is, $S_{12}*=0$; inputting logic signals $V_{WL0A\sim3A}=1$, $V_{WL0\sim}*=1$, $V_{SL0A\sim3A}=V_0$, $V_{SL12}*=V_0$, $V_{SL0\sim3}*=0$, and $V_{WL12}*=1$ respectively, and calculating NOT values $s_0*=\overline{a_0}$, $s_1*=\overline{a_1}$, $s_2*=\overline{b_0}$, $s_3*=\overline{b_1}$ of the input data $a_0a_1b_0b_1$ and storing them in the 1T1R devices $R_{0\sim3}*$ of the 1T1R crossbar $A_2$ respectively;

(S2-3) inputting logic signals $V_{WL0}^*=1$, $V_{WL2}^*=1$, $V_{WL4}^*=1$, $V_{SL0}^*=V_0$, $V_{SL2}^*=V_0$, and $V_{SL4}^*=0$ to calculate a NOR value $$s_4^* = \overline{\overline{a_0} + \overline{b_0}}$$

of $\overline{a_0}$ $\overline{b_0}$ in the 1T1R devices $R_0^*$ and $R_2^*$ of the 1T1R crossbar $A_2$ and storing it in the 1T1R device $R_4^*$ of the 1T1R crossbar $A_2$;

(S2-4) inputting logic signal $V_{WL0}^*=1$, $V_{WL3}^*=1$, $V_{WL5}^*=1$, $V_{SL0}^*=V_0$, $V_{SL3}^*=V_0$, and $V_{SL5}^*=0$ to calculate a NOR value $$s_5^* = \overline{\overline{a_0} + \overline{b_1}}$$

of $\overline{a_0}$ $\overline{b_1}$ in the 1T1R devices $R_0^*$ and $R_3^*$ of the 1T1R crossbar $A_2$ and storing it in the 1T1R device $R_5^*$ of the 1T1R crossbar $A_2$;

(S2-5) inputting logic signal $V_{WL0}^*=1$, $V_{WL3}^*=1$, $V_{WL5}^*=1$, $V_{SL0}^*=V_0$, $V_{SL3}^*=V_0$, and $V_{SL5}^*=0$ to calculate a NOR value $$s_6^* = \overline{\overline{a_1} + \overline{b_0}}$$

of $\overline{a_1}$ $\overline{b_0}$ in the 1T1R devices $R_1^*$ and $R_2^*$ of the 1T1R crossbar $A_2$ and storing it in the 1T1R device $R_6^*$ of the 1T1R crossbar $A_2$;

(S2-6) inputting logic signal $V_{WL0}^*=1$, $V_{WL3}^*=1$, $V_{WL5}^*=1$, $V_{SL0}^*=V_0$, $V_{SL3}^*=V_0$, and $V_{SL5}^*=0$ to calculate a NOR value $$s_7^* = \overline{\overline{a_1} + \overline{b_1}}$$

of $\overline{a_1}$ $\overline{b_1}$ in the 1T1R devices $R_1^*$ and $R_3^*$ of the 1T1R crossbar $A_2$ and storing it in the 1T1R device $R_7^*$ of the 1T1R crossbar $A_2$;

(S2-7) inputting logic signals $V_{WL4}^*=1$, $V_{WL0B}=1$, $V_{WL8}^*=1$, $V_{SL4}^*=V_0$, $V_{SL0B}=V_0$, and $V_{SL8}^*=0$ to calculate a NOT values $s_8^*=\overline{a_0+b_0}$ of data $$\overline{a_0 + b_0}$$

in the 1T1R device $R_4^*$ of the 1T1R crossbar $A_2$ and storing it in the 1T1R device $R_8^{**}$ of the 1T1R crossbar $A_2$;

(S2-8) inputting logic signals $V_{WL5}^*=1$, $V_{WL0B}=1$, $V_{WL9}^*=1$, $V_{SL5}^*=V_0$, $V_{SL0B}=V_0$, and $V_{SL9}^*=0$ to calculate a NOT values $s_9^*=\overline{a_0+b_1}$ of data $$\overline{a_0 + b_1}$$

in the 1T1R device $R_8^*$ of the 1T1R crossbar $A_2$ and storing it in the 1T1R device $R_9^*$ of the 1T1R crossbar $A_2$;

(S2-9) inputting logic signals inputting logic signals $V_{WL6}^*=1$, $V_{WL0B}=1$, $V_{WL10}^*=1$, $V_{SL6}^*=V_0$, $V_{SL0B}=V_0$, and $V_{SL10}^*=0$ to calculate a NOT values $s_{10}^*=\overline{a_1+b_0}$ of data $$\overline{a_1 + b_0}$$

in the 1T1R device $R_6^*$ of the 1T1R crossbar $A_2$ and storing it in the 1T1R device $R_{10}^*$ of the 1T1R crossbar $A_2$;

(S2-10) inputting logic signals inputting logic signals $V_{WL7}^*=1$, $V_{WL0B}=1$, $V_{WL11}^*=1$, $V_{SL7}^*=V_0$, $V_{SL0B}=V_0$, and $V_{SL11}^*=0$ to calculate a NOT values $s_{11}^*=\overline{a_1+b_1}$ of data $$\overline{a_1 + b_1}$$

in the 1T1R device $R_7^*$ of the 1T1R crossbar $A_2$ and storing it in the 1T1R device $R_{11}^*$ of the 1T1R crossbar $A_2$;

(S2-11) inputting logic signals $V_{WL8}^*=1$, $V_{WL11}^*=1$, $V_{WL0B}=1$, $V_{SL8}=V_0$, $V_{SL8}^*=V_0$, and $V_{SL0B}=0$ to calculate a NOR value of data $\overline{a_0+b_0}$ and $\overline{a_1+b_1}$ in the 1T1R devices $R_8^*$ and $R_{11}^*$ of the 1T1R crossbar $A_2$ to obtain a first bit $$P_0 = s_0 = \overline{(\overline{a_0 + b_0}) + (\overline{a_1 + b_1})}$$

of a two-bit multiplication result and storing it in the 1T1R device $R_{0B}$ of the 1T1R crossbar $A_3$;

(S2-12) inputting logic signals $V_{WL11}^*=1$, $V_{WL8}^*=1$, $V_{WL1B}=1$, $V_{SL11}=V_0$, $V_{SL8}=V_0$, and $V_{SL1B}=0$ to calculate a NOR value of data $$\overline{a_1 + b_1}$$

and $\overline{a_0+b_0}$ in the 1T1R devices $R_8^{**}$ and $R_{11}^*$ of the 1T1R crossbar $A_2$ to obtain a second bit $$P_1 = s_0 = \overline{(\overline{a_0 + b_0}) + (\overline{a_1 + b_1})}$$

of the two-bit multiplication result and storing it in a the 1T1R device $R_{1B}$ of the 1T1R crossbar $A_3$ respectively;

(S2-13) inputting logic signals $V_{WL5}^*=1$, $V_{WL10}=1$, $V_{WL13}^*=1$, $V_{SL5}^*=V_0$, $V_{SL10}^*=V_0$, and $V_{SL13}^*=0$ to calculate a NOR value $$s_{13}^* = \overline{(\overline{a_1 + b_0}) + (\overline{a_0 + b_1})}$$

of data $$\overline{a_0 + b_1}$$

and $\overline{a_1+b_0}$ in the 1T1R devices $R_8^*$ and $R_{10}^*$ of the 1T1R crossbar $A_2$ and storing it in the 1T1R device $R_{13}^*$ of the 1T1R crossbar $A_2$ respectively;

inputting logic signals $V_{WL6}^*=1$, $V_{WL9}=1$, $V_{WL14}^*=1$, $V_{SL6}^*=V_0$, $V_{SL9}^*=V_0$, and $V_{SL14}^*=0$ to calculate a NOR value $$s_{14}^* = \overline{\overline{(a_0+\overline{b_1})}+\overline{(\overline{a_1}+b_0)}}$$

of data $$\overline{\overline{a_1}+b_0}$$

and $a_0+b_1$ in the 1T1R devices $R_6^*$ and $R_9^*$ of the 1T1R crossbar $A_2$ and storing it in the 1T1R device $R_{14}^*$ of the 1T1R crossbar $A_2$ respectively; inputting logic signals $V_{WL15}^*=1$, $V_{WL12}^*=1$, $V_{WL2B}^*=1$, $V_{SL13}^*=V_0$, $V_{SL14}^*=V_0$, and $V_{SL15}^*=0$ to calculate a NOR value $$s_{15}^* = \overline{\overline{(a_0+\overline{b_1})}+\overline{(\overline{a_1}+b_0)}+\overline{(\overline{a_1}+b_0)}+\overline{(a_0+\overline{b_1})}}$$

of data $$s_{13}^* = \overline{\overline{(\overline{a_1}+b_0)}+\overline{(a_0+\overline{b_1})}} \text{ and } s_{14}^* = \overline{\overline{(a_0+\overline{b_1})}+\overline{(\overline{a_1}+b_0)}}$$

in the 1T1R devices $R_{13}^*$ and $R_{14}^*$ of the 1T1R crossbar $A_2$; inputting logic signals $V_{WL2A}=1$, $V_{WL12}^*=1$, $V_{WL15}^*=1$, $V_{SL2B}=V_0$, $V_{SL12}^*=V_0$ and $V_{SL15}=V_0$ to obtain a third bit $$P_2 = s_0 = \overline{\overline{(a_0+\overline{b_1})}+\overline{(\overline{a_1}+b_0)}+\overline{(\overline{a_1}+b_0)}+\overline{(a_0+\overline{b_1})}}$$

of the two-bit multiplication result and storing it in a 1T1R device $R_{2B}$ of the 1T1R crossbar $A_3$;

(S2-14) inputting logic signals $V_{WL3B}=1$, $V_{SL3B}=0$, and $V_{BL0}=1$ and setting the 1T1R device $R_{3B}$ of the 1T1R crossbar $A_3$ in low resistance, wherein the data $s_7^*$ in the 1T1R device $R_7^*$ of the 1T1R crossbar $A_2$ is a fourth bit of the two-bit multiplication result; inputting logic signals $V_{WL7}^*=V_{WL3B}=1$, $V_{SL7}^*=0$, and $V_{SL3B}=V_0$ so that the 1T1R device $R_1$ transfers the data $s_7^*$ to the 1T1R device $R_{3B}$ through a transfer operation to obtain a fourth bit $P_3=s_3$ of the two-bit multiplication result.

Figure 6:
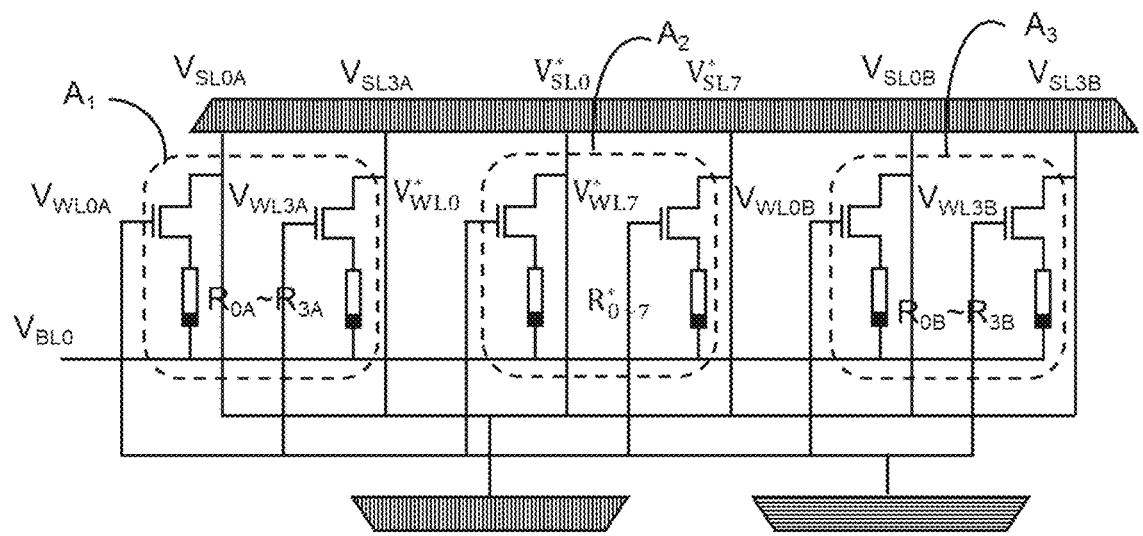
FIG. 6 is an equivalent circuit diagram of an optimized two-bit binary multiplication operation circuit based on a calculation matrix provided by an embodiment of the invention.

FIG. 6 shows an operation circuit based on a calculation matrix provided by the invention and configured to realize an optimized two-bit binary multiplier, and specifically includes, according to input data $a_0a_1$ and $b_0b_1$ and calculated product values $s_{0\sim3}$: a 1T1R crossbar $A_1$, a 1T1R crossbar $A_2$, and a 1T1R crossbar $A_3$; the 1T1R crossbar $A_1$ includes 2 1T1R devices $R_{0A}$ to $R_{1A}$ respectively configured to store initial input data $s_{0A\sim3A}=a_0a_1b_0b_1$ or the operation results $s_{0\sim1}$, word line control signals corresponding to $R_{0A}$ to $R_{3A}$ are $V_{WL0A}$ to $V_{WL1A}$, a bit line control signal corresponding to $R_{0A}$ to $R_{1A}$ is respectively $V_{BL0}$, and source line control signals corresponding to $R_{0A}$ to $R_{1A}$ are respectively $V_{SL0A}$ to $V_{SL1A}$, the 1T1R crossbar $A_2$ includes 8 1T1R devices $R_{0\sim7}^*$ respectively configured to store intermediate calculation results $s_{0\sim7}^*$, word line control signals corresponding to $R_{0\sim7}^*$ are $V_{WL0\sim7}$, a bit line control signal corresponding to $R_{0\sim7}^*$ is $V_{BL0}$, and source line control signals corresponding to $R_{0\sim7}^*$ are $V_{SL0\sim7}^*$; the 1T1R crossbar $A_3$ includes 2 1T1R devices $R_{0B}$ to $R_{1B}$ configured to calculate and store the addition operation results $s_{2\sim3}$, word line control signals corresponding to $R_{0B}$ to $R_{1B}$ are $V_{WL0B}$ to $V_{WL1B}$, a bit line control signal corresponding to $R_{0B}$ to $R_{1B}$ is $V_{BL0}$, and source line control signals corresponding to $R_{0B}$ to $R_{1B}$ are $V_{SL0B}$ to $V_{SL1B}$; the input signals are all controlled and applied by a peripheral circuit; and the intermediate data $s_{0\sim7}^*$ and the calculation results $s_{0\sim3}$ obtained by calculating the 1T1R matrices $A_1$, $A_2$, $A_3$ realize reading and outputting data through a data transfer controller.

Figure 7:
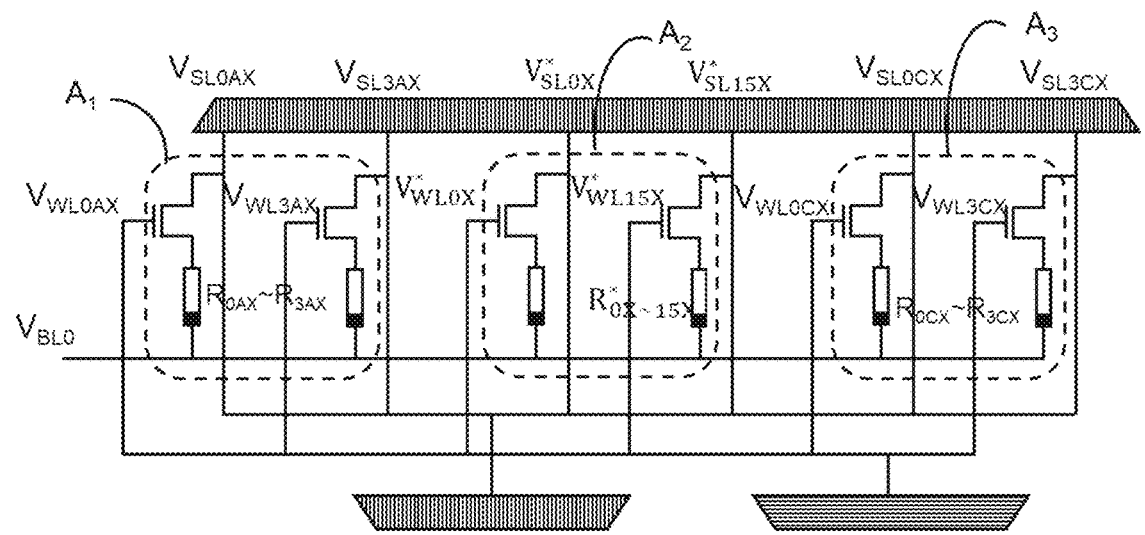
FIG. 7 is an equivalent circuit diagram of a multiple parallel two-bit binary multiplication operation circuit based on a calculation matrix provided by an embodiment of the invention.

With reference to the operation circuit based on a calculation matrix shown in FIG. 6, the operation method provided by the invention includes the following steps:

(S3-1) inputting logic signals $V_{WL0A}=1$, $V_{SL0A}=a_0$, and $V_{BL0}=\overline{a_0}$ and writing the operation data $a_0$ inputted into $R_{0A}$ of the 1T1R crossbar $A_1$, that is, $s_{0A}=a_0$; inputting logic signals $V_{WL1A}=1$, $V_{SL0A}=0$, and $V_{BL0}=1$ and setting $R_{1A}$ of the 1T1R crossbar $A_1$ to high resistance, that is, $s_{1A}=0$;

inputting logic signals $V_{WL0A}=1$, $V_{WL1A}=1$, $V_{WL0}^*=1$, $V_{SL0A}=V_0$, $V_{SL1A}=V_0$, and $V_{SL0}^*=0$ and obtaining a NOT value from data $s_{0A}=a_0$ and store it in the 1T1R device $R_{0A}$ of the 1T1R crossbar $A_1$ in $R_0^*$ of a 1T1R crossbar $A_2$, that is, $s_0^*=\overline{a_0}$;

(S3-2) inputting logic signals $V_{WL0A}=1$, $V_{SL0A}=a_1$, and $V_{BL0}=\overline{a_1}$ and writing the operation data $a_1$ inputted into $R_{0A}$ of the 1T1R crossbar $A_1$, that is, $s_{0A}=a_1$; inputting logic signals $V_{WL0A}=1$, $V_{WL1A}=1$, $V_{WL1}^*=1$, $V_{SL0A}=V_0$, $V_{SL1A}=V_0$, and $V_{SL1}^*=0$ and obtaining a NOT value from data $s_{0A}=a_1$ and store it in the 1T1R device $R_{0A}$ of the 1T1R crossbar $A_1$ in $R_1^*$ of the 1T1R crossbar $A_2$, that is, $s_0^*=\overline{a_1}$;

(S3-3) inputting logic signals $V_{WL0A}=1$, $V_{SL0A}=b_0$, and $V_{BL0}=\overline{b_0}$ and writing the operation data $b_0$ inputted into $R_{0A}$ of the 1T1R crossbar $A_1$, that is, $s_{0A}=b_0$; inputting logic signals $V_{WL0A}=1$, $V_{WL1A}=1$, $V_{WL2}^*=1$, $V_{SL0A}=V_0$, $V_{SL1A}=V_0$, and $V_{SL2}^*=0$ and obtaining a NOT value from data $s_{0A}=b_0$ and store it in the 1T1R device $R_{0A}$ of the 1T1R crossbar $A_1$ in $R_2^*$ of the 1T1R crossbar $A_2$, that is, $s_0^*=\overline{b_0}$;

(S3-4) inputting logic signals $V_{WL0A}=1$, $V_{SL0A}=b_1$, and $V_{BL0}=\overline{b_1}$ and writing the operation data $b_1$ inputted into $R_{0A}$ of the 1T1R crossbar $A_1$, that is, $s_{0A}=b_1$; inputting logic signals $V_{WL0A}=1$, $V_{WL1A}=1$, $V_{SL0A}=V_0$, $V_{SL1A}=V_0$, and $V_{SL3}^*=0$ and obtaining a NOT value from data $s_{0A}=b_1$ and store it in the 1T1R device $R_{0A}$ of the 1T1R crossbar $A_1$ in of the 1T1R crossbar $A_2$, that is, $s_0^*=\overline{b_1}$;

(S3-5) inputting logic signals $V_{WL0}^*=1$, $V_{WL2}^*=1$, $V_{WL4}=1$, $V_{SL0}=V_0$, $V_{SL2}^*=V_0$, and $V_{SL4}=0$ to calculate a NOR value $$s_4^* = \overline{\overline{a_0}+\overline{b_0}}$$

of $\overline{a_0}$ $\overline{b_0}$ in the 1T1R devices $R_0^*$ and $R_2^*$ the 1T1R crossbar $A_2$ and storing it in a 1T1R device $R_4^*$ of the 1T1R crossbar $A_2$;

(S3-6) inputting logic signals inputting logic signals $V_{WL0}^*=1$, $V_{WL3}^*=1$, $V_{WL4}=1$, $V_{SL0}=V_0$, $V_{SL3}^*=V_0$, and $V_{SL5}=0$ to calculate a NOR value $$s_5^* = \overline{\overline{a_0}+\overline{b_1}}$$

of $\overline{a_0}\,\overline{b_1}$ in the 1T1R devices $R_0^*$ and $R_3^*$ the 1T1R crossbar $A_2$ and storing it in a 1T1R device $R_8^*$ of the 1T1R crossbar $A_2$;

(S3-7) inputting logic signals $V_{WL1}^*=1$, $V_{WL2}^*=1$, $V_{WL0}=1$, $V_{SL1}=V_0$, $V_{SL2}^*=V_0$, and $V_{SL0}=0$ to calculate a NOR value $$s_0^* = \overline{\overline{a_1} + \overline{b_0}}$$

of $\overline{a_1}\,\overline{b_0}$ in the 1T1R devices $R_1^*$ and $R_2^*$ of the 1T1R crossbar $A_2$ and storing it in a 1T1R device $R_0^*$ of the 1T1R crossbar $A_2$;

(S3-8) inputting logic signals $V_{WL1}^*=1$, $V_{WL3}^*=1$, $V_{WL2}=1$, $V_{SL0}=V_0$, $V_{SL3}^*=V_0$, and $V_{SL2}=0$ to calculate a NOR value $$s_2^* = \overline{\overline{a_1} + \overline{b_1}}$$

of $\overline{a_1}\,\overline{b_1}$ in the 1T1R devices $R_1^*$ and $R_3^*$ of the 1T1R crossbar $A_2$ and storing it in the 1T1R device $R_2^*$ of the 1T1R crossbar $A_2$, which is a fourth bit $$P_3 = s_2^* = \overline{\overline{a_1} + \overline{b_1}}$$

of a two-bit binary multiplication result;

(S3-9) inputting logic signals $V_{WL0}^*=1$, $V_{WL1A}=1$, $V_{WL1}^*=1$, $V_{SL0}^*=V_0$, $V_{SL1A}=V_0$, and $V_{SL1}^*=0$ to calculate a NOT value $s_1^*=\overline{\overline{a_1}+\overline{b_0}}$ of $$\overline{a_1} + \overline{b_0}$$

in the 1T1R device $R_1^*$ of the 1T1R crossbar $A_2$ and storing it in the 1T1R device $R_1^*$ of the 1T1R crossbar $A_2$;

(S3-10) inputting logic signals $V_{WL5}^*=1$, $V_{WL1A}=1$, $V_{WL3}^*=1$, $V_{SL5}^*=V_0$, $V_{SL1A}=V_0$, and $V_{SL3}^*=0$ to calculate a NOT value $s_3^*=\overline{\overline{a_1}+\overline{b_1}}$ of $$\overline{a_0} + \overline{b_1}$$

in the 1T1R device $R_8^*$ of the 1T1R crossbar $A_2$ and storing it in the 1T1R device $R_3^*$ of the 1T1R crossbar $A_2$;

(S3-11) inputting logic signals $V_{WL5}^*=1$, $V_{WL1}^*=1$, $V_{WL0A}=1$, $V_{SL5}^*=V_0$, $V_{SL1}^*=V_0$, and $V_{SL0A}=0$ to calculate a NOR value $$s_0 = \overline{(\overline{a_1} + \overline{b_0}) + (\overline{a_0} + \overline{b_1})}$$

of data $$\overline{a_0} + \overline{b_1}$$

and $\overline{a_1}+\overline{b_0}$ in the 1T1R devices $R_8^*$ and $R_1^*$ of the 1T1R crossbar $A_2$ and storing it in the 1T1R device $R_0^*$ of the 1T1R crossbar $A_1$ respectively;

(S3-12) inputting logic signals $V_{WL0}^*=1$, $V_{WL3}^*=1$, $V_{WL1A}=1$, $V_{SL0}^*=V_0$, $V_{SL3}^*=V_0$, and $V_{SL1A}=0$ to calculate a NOR value $$s_1 = \overline{(\overline{a_0} + \overline{b_1}) + (\overline{a_1} + \overline{b_0})}$$

of data $$\overline{a_1} + \overline{b_0}$$

and $\overline{a_1}+\overline{b_1}$ in the 1T1R devices $R_0^*$ and $R_3^*$ of the 1T1R crossbar $A_2$ and storing it in the 1T1R device $R_1^*$ of the 1T1R crossbar $A_1$ respectively;

(S3-13) inputting logic signals $V_{WL0}^*=1$, $V_{SL0}^*=0$, and $V_{BL0}=1$ and setting $R_0^*$ of the 1T1R crossbar $A_2$ in high resistance, that is, $s_0^*=0$; inputting logic signals $V_{WL0A}=1$, $V_{WL1A}=1$, $V_{WL1}^*=1$, $V_{SL0A}=V_0$, $V_{SL1A}=V_0$, and $V_{SL1}^*=0$ to calculate a NOR value $$s_1^* = \overline{(\overline{a_0} + \overline{b_1}) + (\overline{a_1} + \overline{b_0}) + (\overline{a_1} + \overline{b_0}) + (\overline{a_0} + \overline{b_1})}$$

of data $$s_0 = \overline{(\overline{a_1} + \overline{b_0}) + (\overline{a_0} + \overline{b_1})} \text{ and } s_1 = \overline{(\overline{a_0} + \overline{b_1}) + (\overline{a_1} + \overline{b_0})}$$

in the 1T1R devices $R_0^*$ and $R_1^*$ of the 1T1R crossbar $A_1$; inputting logic signals $V_{WL0A}=1$, $V_{WL0}^*=1$, $V_{WL1}^*=1$, $V_{SL0A}=V_0$, and $V_{SL0}^*=0$ to calculate a third bit $$P_2 = s_0 = \overline{(\overline{a_0} + \overline{b_1}) + (\overline{a_1} + \overline{b_0}) + (\overline{a_1} + \overline{b_0}) + (\overline{a_0} + \overline{b_1})}$$

of a two-bit multiplication result and storing it in the 1T1R device $R_0^*$ of the 1T1R crossbar $A_1$ respectively;

(S3-14) inputting logic signals $V_{WL0}^*=1$, $V_{WL1}^*=1$, $V_{WL2}^*=1$, $V_{SL0}^*=V_0$, $V_{SL1}=0$, and $V_{SL2}^*=V_0$, to calculate a NOT value $s_1^*=\overline{\overline{a_1}+\overline{b_1}}$ of $$(\overline{a_1} + \overline{b_1})$$

in the 1T1R device $R_2^*$ of the 1T1R crossbar $A_2$ and storing it in the 1T1R device $R_3^*$ of the 1T1R crossbar $A_2$;

(S3-15) inputting logic signals $V_{WL0}^*=1$, $V_{WL3}^*=1$, $V_{WL4}^*=1$, $V_{SL0}^*=V_0$, $V_{SL3}=0$, and $V_{SL4}^*=V_0$, to calculate a NOT value $s_3^*=\overline{\overline{a_0}+\overline{b_1}}$ of $$\overline{a_0} + \overline{b_0}$$

in the 1T1R device $R_4^*$ of the 1T1R crossbar $A_2$ and storing it in the 1T1R device $R_3^*$ of the 1T1R crossbar $A_2$;

(S3-16) inputting logic signals $V_{WL1}^*=1$, $V_{WL3}^*=1$, $V_{WL1A}=1$, $V_{SL1}^*=V_0$, $V_{SL3}^*=0$, and $V_{SL1A}=V_0$ to obtain $$\overline{(\overline{a_1}+\overline{b_1})+(\overline{a_0}+\overline{b_0})}$$

of a first bit $P_0=s_1$ of the two-bit multiplication result in the 1T1R devices $R_1^*$ and $R_3^*$ of the 1T1R crossbar $A_2$ and storing it in the 1T1R device $R_1$ of the 1T1R crossbar $A_1$;

(S3-17) inputting logic signals $V_{WL0}^*=1$, $V_{WL2}^*=1$, $V_{WL3}^*=1$, $V_{SL0}^*=0$, $V_{SL3}=V_0$, and $V_{SL3}^*=V_0$ to obtain $$\overline{(\overline{a_1}+\overline{b_1})+(\overline{a_0}+\overline{b_0})}$$

of a second bit $P_1=s_1$ of the two-bit multiplication result in the 1T1R devices $R_2^*$ and $R_3^*$ of the 1T1R crossbar $A_2$ and storing it in the 1T1R device $R_0^*$ of the 1T1R crossbar $A_2$;

FIG. 7 shows an operation circuit based on a calculation matrix provided by the invention and configured to realize a multiple parallel two-bit binary multiplier, and specifically, which calculates product value $s_{00}s_{10}s_{20}s_{30}$ to $s_{0(n-1)}s_{1(n-1)}s_{2(n-1)}s_{3(n-1)}$ according to input data $a_{00}a_{10}b_{00}b_{10}$ to $a_{0(n-1)}a_{1(n-1)}b_{0(n-1)}b_{1(n-1)}$, wherein n represents module number: n 1T1R matrices $A_0$ to $A_{(n-1)}$, n 1T1R matrices $B_0$ to $B_{(n-1)}$, and n 1T1R matrices $C_0$ to $C_{(n-1)}$; each of the n 1T1R matrices $A_0$ to $A_{(n-1)}$ includes 4 1T1R devices $R_{0A}$ to $R_{3A}$, respectively configured to store and calculate 4-bit initial input data $s_{0A~3A}$, word line control signals corresponding to $R_{0A}$ to $R_{3A}$ are $V_{WL0A}$ to $V_{WL3A}$, a bit line control signal corresponding to $R_{0A}$ to $R_{3A}$ is respectively $V_{BL0x}$, and source line control signals corresponding to $R_{0A}$ to $R_{3A}$ are respectively $V_{SL0A}$ to $V_{SL3A}$; each of then 1T1R matrices $B_0$ to $B_{(n-1)}$ includes 16 1T1R devices $R_{0~15}^*$ respectively configured to store intermediate calculation results $s_{0~15}^*$, word line control signals corresponding to $R_{0~15}^*$ are $V_{WL0~15}^*$ a bit line control signal corresponding to $R_{0~15}^*$ is $V_{BL0x}$, and source line control signals corresponding to $R_{0~15}^*$ are $V_{SL0~15}^*$; each of the n 1T1R matrices $C_0$ to $C_{(n-1)}$ includes 4 1T1R devices $R_{0C}$ to $R_{3C}$ configured to calculate and store addition operation results $s_{0~3}$, word line control signals corresponding to $R_{0C}$ to $R_{3C}$ are $V_{WL0C}$ to $V_{WL3C}$, a bit line control signal corresponding to $R_{0C}$ to $R_{3C}$ is $V_{BL0x}$, and source line control signals corresponding to $R_{0C}$ to $R_{3C}$ are $V_{SL0C}$ to $V_{SL3C}$; the input signals are all controlled and applied by a peripheral circuit; intermediate data $s_{0x~15x}^*$ and calculation results $s_{0x~3x}$ obtained by calculating the 1T1R matrices A, B, and C realize reading and outputting data through a data transfer controller, wherein x represents an x-th module; at the same time, it is assured that the bit lines of each module are the same and the bit lines of different modules are different.

With reference to the operation circuit based on a calculation matrix shown in FIG. 7, the operation method provided by the invention includes the following steps:

(S4-1) inputting logic signals $V_{WL0Ax}=1$, $V_{SL0Ax}=a_{0x}$, and $V_{BL0}=\overline{a_{0x}}$ and writing the operation data $a_{0x}$ inputted into $R_{0Ax}$ of a 1T1R crossbar $A_1$; inputting logic signals $V_{WL1Ax}=1$, $V_{SL1Ax}=a_{1x}$, and $V_{BL0x}=\overline{a_{1x}}$ and writing the operation data $a_{1x}$ inputted into $R_{1Ax}$ of a 1T1R crossbar $A_x$; inputting logic signals $V_{WL2A}=1$, $V_{SL2A}=b_{0x}$, and $V_{BL0}=b_{0x}$ and writing the operation data $b_{0x}$ inputted into $R_{2Ax}$ of the 1T1R crossbar $A_x$; inputting logic signals $V_{WL3Ax}=1$, $V_{SL3Ax}=b_{1x}$, and $V_{BL0}=\overline{b_{1x}}$ and writing the operation data $b_{1x}$ inputted into $R_{3Ax}$ of the 1T1R crossbar $A_x$;

(S4-2) inputting logic signals $V_{WL12x}^*=1$, $V_{SL12x}^*=0$, and $V_{BL0x}=1$ and setting a 1T1R device $R_{12x}^*$ in high resistance, that is, $s_{12x}^*=0$; inputting logic signals $V_{WL0Ax~3Ax}=1$, $V_{WL0x~3x}^*=1$, $V_{SL0Ax~3Ax}=V_0$, $V_{SL12x}^*=V_0$, $V_{SL0x~3x}^*=0$, and $V_{WL12x}^*=0$ respectively and calculating NOT values $s_{0x}^*=\overline{a_{0x}}$, $s_{1x}^*=\overline{a_{1x}}$, $s_{2x}^*=\overline{b_{0x}}$, $s_{3x}^*=\overline{b_{1x}}$ of an input data $a_{0x}a_{1x}b_{0x}b_{1x}$ and storing them in 1T1R devices $R_{0x*~3x}^*$ of a 1T1R crossbar $B_x$ respectively;

(S4-3) inputting logic signals $V_{WL0x}^*=1$, $V_{WL2x}^*=1$, $V_{WL4x}^*=1$, $V_{SL0x}^*=V_0$, $V_{SL2x}^*=V_0$, and $V_{SL4x}^*=0$ to calculate a NOR value $$s_{4x}^* = \overline{\overline{a_{0x}}+\overline{b_{0x}}}$$

of $\overline{a_{0x}b_{0x}}$ in the 1T1R devices $R_{0x}^*$ and $R_{2x}^*$ of the 1T1R crossbar $B_x$ and storing it in a 1T1R device $R_{4x}^*$ of the 1T1R crossbar $B_x$;

(S4-4) inputting logic signals $V_{WL0x}^*=1$, $V_{WL3x}^*=1$, $V_{WL5x}^*=1$, $V_{SL0x}^*=V_0$, $V_{SL3x}^*=V_0$, and $V_{SL5x}^*=0$ to calculate a NOR value $$s_{5x}^* = \overline{\overline{a_{0x}}+\overline{b_{1x}}}$$

of $\overline{a_{0x}}$ and $\overline{b_{1x}}$ in the 1T1R devices $R_{0x}^*$ and $R_{3x}^*$ of the 1T1R crossbar $B_x$ and storing it in a 1T1R device $R_{5x}^*$ of the 1T1R crossbar $B_x$;

(S4-5) inputting logic signals $V_{WL1x}^*=1$, $V_{WL2x}^*=1$, $V_{WL6x}^*=1$, $V_{SL1x}^*=V_0$, $V_{SL2x}^*=V_0$, and $V_{SL6x}^*=0$ to calculate a NOR value $$s_{6x}^* = \overline{\overline{a_{1x}}+\overline{b_{0x}}}$$

of $\overline{a_{1x}}$ and $\overline{b_{0x}}$ in the 1T1R devices $R_{1x}^*$ and $R_{2x}^*$ of the 1T1R crossbar $B_x$ and storing it in a 1T1R device $R_{6x}^*$ of the 1T1R crossbar $B_x$;

(S4-6) inputting logic signals $V_{WL1x}^*=1$, $V_{WL3x}^*=1$, $V_{WL7x}^*=1$, $V_{SL1x}^*=V_0$, $V_{SL3x}^*=V_0$, and $V_{SL7x}^*=0$ to calculate a NOR value $$s_{7x}^* = \overline{\overline{a_{1x}}+\overline{b_{1x}}}$$

of $\overline{a_{1x}}$ and $\overline{b_{1x}}$ in the 1T1R devices $R_{1x}^*$ and $R_{3x}^*$ of the 1T1R crossbar $B_x$ and storing it in a 1T1R device $R_{7x}^*$ of the 1T1R crossbar $B_x$;

(S4-7) inputting logic signals $V_{WL4x}^*=1$, $V_{WL0Bx}=1$, $V_{WL8x}^*=1$, $V_{SL4x}^*=V_0$, $V_{SL0Bx}=V_0$, and $V_{SL8x}^*=0$ to calculate a NOT value $s_{8x}^*=\overline{\overline{a_{0x}}+\overline{b_{0x}}}$ of data $$\overline{\overline{a_{0x}}+\overline{b_{0x}}}$$

in the 1T1R device $R_{4x}^*$ of the 1T1R crossbar $B_x$ and storing it in a 1T1R device $R_{8x}^*$ of the 1T1R crossbar $B_x$;

(S4-8) inputting logic signals $V_{WL5x}^*=1$, $V_{WL0Bx}=1$, $V_{WL9x}^*=1$, $V_{SL5x}^*=V_0$, $V_{SL0Bx}=V_0$, and $V_{SL9x}^*=0$ to calculate a NOT value $s_{9x}^*=\overline{a_{0x}+b_{1x}}$ of data $$\overline{a_{0x}+b_{1x}}$$

in the 1T1R device $R_{5x}^*$ of the 1T1R crossbar $B_x$ and storing it in a 1T1R device $R_{9x}^*$ of the 1T1R crossbar $B_x$ respectively;

(S4-9) inputting logic signals $V_{WL6x}^*=1$, $V_{WL0Bx}=1$, $V_{WL10x}^*=1$, $V_{SL6x}^*=V_0$, $V_{SL0Bx}=V_0$, and $V_{SL10x}^*=0$ to calculate a NOT value $s_{10x}^*=\overline{a_{1x}+b_{0x}}$ of data $$\overline{a_{1x}+b_{0x}}$$

in the 1T1R device $R_{6x}^*$ of the 1T1R crossbar $B_x$ and storing it in a 1T1R device $R_{10x}^*$ of the 1T1R crossbar $B_x$;

(S4-10) inputting logic signals $V_{WL7x}^*=1$, $V_{WL0Bx}=1$, $V_{WL11x}^*=1$, $V_{SL7x}^*=V_0$, $V_{SL0Bx}=V_0$, and $V_{SL11x}^*=0$ to calculate a NOT value $s_{11x}^*=\overline{a_{1x}+b_{1x}}$ of data $$\overline{a_{1x}+b_{1x}}$$

in the 1T1R device $R_{7x}^*$ of the 1T1R crossbar $B_x$ and storing it in a 1T1R device $R_{11x}^*$ of the 1T1R crossbar $B_x$;

(S4-11) inputting logic signals $V_{WL8x}^*=1$, $V_{WL11x}^*=1$, $V_{WL0Bx}^*=1$, $V_{SL8x}^*=V_0$, $V_{SL11x}^*=V_0$, and $V_{SL0Bx}=0$ to calculate a NOR value of data $a_{0x}+b_{0x}$ and $a_{1x}+b_{1x}$ in the 1T1R devices $R_{8x}^*$ and $R_{11x}^*$ of the 1T1R crossbar $B_x$ to obtain a first bit $$P_{0x}=s_{0x}=\overline{(\overline{a_{0x}+b_{0x}})+(\overline{a_{1x}+b_{1x}})}$$

of a two-bit multiplication result and storing it in a 1T1R device $R_{0Bx}$ of a 1T1R crossbar $C_x$;

(S4-12) inputting logic signals $V_{WL11x}^*=1$, $V_{WL8x}^*=1$, $V_{WL1Bx}^*=1$, $V_{SL11x}^*=V_0$, $V_{SL8x}^*=V_0$, and $V_{SL1Bx}=0$ to calculate a NOR value of data $$\overline{a_{1x}+b_{1x}}$$

and $\overline{a_{0x}+b_{0x}}$ in the 1T1R devices $R_{8x}^*$ and $R_{11x}^*$ of the 1T1R crossbar $B_x$ to obtain a second bit $$P_{1x}=s_{0x}=\overline{(\overline{a_{0x}+b_{0x}})+(\overline{a_{1x}+b_{1x}})}$$

of the two-bit multiplication result and storing it in a 1T1R device $R_{1Bx}$ of a 1T1R crossbar $C_x$ respectively;

(S4-13) inputting logic signals $V_{WL5x}^*=1$, $V_{WL10x}^*=1$, $V_{WL13x}^*=1$, $V_{SL5x}^*=V_0$, $V\,SL10^*=V_0$, and $V_{SL13x}^*=0$ to calculate a NOR value $$s_{13}^*=\overline{(\overline{a_{1x}+b_{0x}})+(\overline{a_{0x}+b_{1x}})}$$

of data $$\overline{a_{0x}+b_{1x}}$$

and $a_{1x}+b_{0x}$ in the 1T1R devices $R_{5x}^*$ and $R_{10x}^*$ of the 1T1R crossbar $B_x$ and storing it in a 1T1R device $R_{13x}^*$ of the 1T1R crossbar $B_x$ respectively;

inputting logic signals $V_{WL6x}^*=1$, $V_{WL9x}^*=1$, $V_{WL14x}^*=1$, $V_{SL6x}^*=V_0$, $V\,SL9^*=V_0$, and $V_{SL14x}^*=0$ to calculate a NOR value $$s_{14x}^*=\overline{(\overline{a_{0x}+b_{1x}})+(\overline{a_{1x}+b_{0x}})}$$

of data $$\overline{a_{1x}+b_{0x}}$$

and $\overline{a_{0x}+b_{1x}}$ in the 1T1R devices $R_{6x}^*$ and $R_{9x}^*$ of the 1T1R crossbar $B_x$ and storing it in a 1T1R device $R_{14x}^*$ of the 1T1R crossbar $B_x$ respectively; inputting logic signals $V_{WL15x}^*=1$, $V_{WL12x}^*=1$, $V_{WL2Bx}^*=$, $V_{SL13x}^*=V_0$, $V_{SL14x}^*=V_0$, and $V_{SL15x}^*=0$ to calculate a NOR value $$s_{15x}^*=\overline{(\overline{a_{0x}+b_{1x}})+(\overline{a_{1x}+b_{0x}})+(\overline{a_{1x}+b_{0x}})+(\overline{a_{0x}+b_{1x}})}$$

of data $$s_{13x}^*=\overline{(\overline{a_{1x}+b_{0x}})+(\overline{a_{0x}+b_{1x}})} \text{ and } s_{14x}^*=\overline{(\overline{a_{0x}+b_{1x}})+(\overline{a_{1x}+b_{0x}})}$$

in the 1T1R devices $R_{13x}^*$ and $R_{14x}^*$ of the 1T1R crossbar $B_x$; inputting logic signals $V_{WL2Ax}=1$, $V_{WL12x}^*=1$, $V_{WL15x}^*=1$, $V_{SL2Bx}=0$, $V_{SL12x}^*=0$, and $V_{SL15x}^*=V_0$ to obtain a third bit $$P_{x2}=s_{0x}=\overline{(\overline{a_{0x}+b_{1x}})+(\overline{a_{1x}+b_{0x}})+(\overline{a_{1x}+b_{0x}})+(\overline{a_{0x}+b_{1x}})}$$

of the two-bit multiplication result and storing it in a 1T1R device $R_{2Bx}$ of the 1T1R crossbar $C_x$;

(S4-14) inputting logic signals $V_{WL3Bx}=1$, $V_{SL3Bx}=0$, and $V_{BL0x}=1$ and setting a 1T1R device $R_{3BX}$ of the 1T1R crossbar $C_x$ in low resistance, wherein the data $s_{7x}^*$ in the 1T1R device $R_{7x}^*$ of the 1T1R crossbar $B_x$ is a fourth bit of the two-bit multiplication result; inputting logic signals $V_{WL7x}^*=V_{WL3Bx}=1$, $V_{SL7x}^*=0$, $V_{SL3Bx}=V_0$ so that the 1T1R device $R_{7x}^*$ transfers the data $s_{7x}^*$ to the 1T1R device $R_{3BX}$ through a transfer operation to obtain a fourth bit $P_{3x}=s_{3x}$ of the two-bit multiplication result.

It is easy for those skilled in the art to understand that the above are only preferred embodiments of the invention and are not intended to limit the invention. Any modification, equivalent replacement, and improvement made within the spirit and principles of the invention should be included in the scope of the invention.

The invention achieves the fusion of calculation and storage, reduces the complexity of an integrated circuit, and may achieve 16 kinds of basic Boolean logic operations and digital circuit operations even more complicated.

What is claimed is:

1. A multiplier based on a 1T1R memory configured to realize two-bit multiplication, which calculates product values $s_{0\sim3}$ according to input data $a_0a_1$ and $b_0b_1$, wherein the multiplier comprises: a 1T1R crossbar $A_1$, a 1T1R crossbar $A_2$, a 1T1R crossbar $A_3$, and a peripheral circuit;

the 1T1R crossbar $A_1$ comprises: 4 1T1R devices $R_{0A}$ to $R_{3A}$, respectively configured to store and calculate 4-bit initial input data $s_{0A\sim3A}=a_0a_1b_0b_1$, word line control signals corresponding to $R_{0A}$ to $R_{3A}$ are $V_{WL0A}$ to $V_{WL3A}$, a bit line control signal corresponding to $R_{0A}$ to $R_{3A}$ is $V_{BL0}$, and source line control signals corresponding to $R_{0A}$ to $R_{3A}$ are $V_{SL0A}$ to $V_{SL3A}$ respectively;

the 1T1R crossbar $A_2$ comprises: 15 1T1R devices $R_{0\sim14}*$ respectively configured to store intermediate calculation results $s_{0\sim14}*$, word line control signals corresponding to $R_{0\sim14}*$ are $V_{WL0\sim14}*$, a bit line control signal corresponding to $R_{0\sim14}*$ is $V_{BL0}$, and source line control signals corresponding to $R_{0\sim14}*$ are $V_{SL0\sim14}*$;

the 1T1R crossbar $A_3$ comprises: 4 1T1R devices $R_{0B}$ to $R_{3B}$ configured to calculate and store addition operation results $s_{0\sim3}$, word line control signals corresponding to $R_{0B}$ to $R_{3B}$ are $V_{WL0B}$ to $V_{WL3B}$, a bit line control signal corresponding to $R_{0B}$ to $R_{3B}$ is $V_{BL0}$, and source line control signals corresponding to $R_{0B}$ to $R_{3B}$ are $V_{SL0B}$ to $V_{SL3B}$;

the input signals are all controlled and applied by the peripheral circuit; the intermediate data $s_{0\sim14}*$ and the calculation results $s_{0\sim3}$ obtained by calculating the 1T1R matrices $A_1$, $A_2$, and $A_3$ realize data reading and outputting through a data transfer controller of the peripheral circuit.

2. An operation method based on the multiplier of claim 1, comprising the following steps:

(S2-1) inputting logic signals $V_{WL0A}*=1$, $V_{SL0A}=a_0$, and $V_{BL0}=\overline{a_0}$, writing the operation data $a_0$ inputted into $R_{0A}$ of the 1T1R crossbar $A_1$; inputting logic signals $V_{WL1A}=1$, $V_{SL1A}=a_1$, and $V_{BL0}=\overline{a_1}$ and writing the operation data $a_1$ inputted into $R_{1A}$ of the 1T1R crossbar $A_1$; inputting logic signals $V_{WL2A}*=1$, $V_{SL2A}=b_0$, and $V_{BL0}=\overline{b_0}$ and writing the operation data $b_0$ inputted into $R_{2A}$ of the 1T1R crossbar $A_1$; inputting logic signals $V_{WL3A}=1$, $V_{SL3A}=1$, and $V_{BL0}=\overline{b_1}$ and writing the operation data $b_1$ inputted into $R_{3A}$ of the 1T1R crossbar $A_1$;

(S2-2) inputting logic signals $V_{WL12}*=1$, $V_{SL12}*=0$, and $V_{BL0}=1$ and setting the 1T1R device $R_{12}*$ in high resistance, that is, $s_{12}*=0$; inputting logic signals $V_{WL0A\sim3A}=1$, $V_{WL0\sim3}*=1$, $V_{SL0A\sim3A}=V_0$, $V_{SL12}*=V_0$, $V_{SL0\sim3}*=0$, and $V_{WL12}*=1$ respectively, and calculating NOT values $s_0*=\overline{a_0}$, $s_1*=\overline{a_1}$, $s_2*=\overline{b_0}$, $s_3*=\overline{b_1}$ of the input data $a_0a_1b_0b_1$ and storing them in the 1T1R devices $R_{0\sim3}*$ of the 1T1R crossbar $A_2$ respectively;

(S2-3) inputting logic signals $V_{WL0}*=1$, $V_{WL2}*=1$, $V_{WL4}*=1$, $V_{SL0}*=V_0$, $V_{SL2}*=V_0$, and $V_{SL4}*=0$ to calculate a NOR value $$s_4^* = \overline{\overline{a_0} + \overline{b_0}} \text{ of } \overline{a_0}\,\overline{b_0}$$

in the 1T1R devices $R_0*$ and $R_2*$ of the 1T1R crossbar $A_2$ and storing it in the 1T1R device $R_4*$ of the 1T1R crossbar $A_2$;

(S2-4) inputting logic signals $V_{WL0}*=1$, $V_{WL3}*=1$, $V_{WL5}*=1$, $V_{SL0}*=V_0$, $V_{SL3}*=V_0$, and $V_{SL5}*=0$ to calculate a NOR value $$s_5^* = \overline{\overline{a_0} + \overline{b_1}}$$

of $\overline{a_0}\,\overline{b_1}$ in the 1T1R devices $R_0*$ and $R_3*$ of the 1T1R crossbar $A_2$ and storing it in the 1T1R device $R_5*$ of the 1T1R crossbar $A_2$;

(S2-5) inputting logic signals $V_{WL1}*=1$, $V_{WL2}*=1$, $V_{WL6}=1$, $V_{SL1}*=V_0$, $V_{SL2}*=V_0$, and $V_{SL6}*=0$ to calculate a NOR value $$s_6^* = \overline{\overline{a_1} + \overline{b_0}}$$

of $\overline{a_1}\,\overline{b_0}$ in the 1T1R devices $R_1*$ and $R_2*$ of the 1T1R crossbar $A_2$ and storing it in the 1T1R device $R_6*$ of the 1T1R crossbar $A_2$;

(S2-6) inputting logic signals $V_{WL1}*=1$, $V_{WL3}*=1$, $V_{WL7}*=1$, $V_{SL1}*=V_0$, $V_{SL3}*=V_0$, and $V_{SL7}*=0$ to calculate a NOR value $$s_7^* = \overline{\overline{a_1} + \overline{b_1}}$$

of $\overline{a_1}\,\overline{b_1}$ in the 1T1R devices $R_1*$ and $R_3*$ of the 1T1R crossbar $A_2$ and storing it in the 1T1R device $R_7*$ of the 1T1R crossbar $A_2$;

(S2-7) inputting logic signals $V_{WL4}*=1$, $V_{WL0B}=1$, $V_{WL8}*=1$, $V_{SL4}*=V_0$, $V_{SL0B}=V_0$, and $V_{SL8}*=0$ to calculate a NOT value $s_8*=\overline{a_0+b_0}$ of data $$\overline{a_0 + b_0}$$

in the 1T1R device $R_4*$ of the 1T1R crossbar $A_2$ and storing it in the 1T1R device $R_8*$ of the 1T1R crossbar $A_2$;

(S2-8) inputting logic signals $V_{WL5}*=1$, $V_{WL0B}=1$, $V_{WL9}*=1$, $V_{SL4}*=V_0$, $V_{SL0B}=V_0$, and $V_{SL9}*=0$ to calculate a NOT value $s_9*=\overline{a_0+b_1}$ of data $$\overline{a_0 + b_1}$$

in the 1T1R device $R_5*$ of the 1T1R crossbar $A_2$ and storing it in the 1T1R device $R_9*$ of the 1T1R crossbar $A_2$;

(S2-9) inputting logic signals $V_{WL6}*=1$, $V_{WL0B}=1$, $V_{WL10}*=1$, $V_{SL6}*=V_0$, $V_{SL0B}=V_0$, and $V_{SL10}*=0$ to calculate a NOT value $s_{10}*=\overline{a_1+b_0}$ of data $$\overline{a_1 + b_0}$$

in the 1T1R device $R_6*$ of the 1T1R crossbar $A_2$ and storing it in the 1T1R device $R_{10}*$ of the 1T1R crossbar $A_2$;

(S2-10) inputting logic signals $V_{WL7}*=1$, $V_{WL0B}=1$, $V_{WL11}*=1$, $V_{SL7}*=V_0$, $V_{SL0B}=V_0$, and $V_{SL11}*=0$ to calculate a NOT value $s_{11}*=\overline{a_1+b_1}$ of data $\overline{\overline{a_1} + \overline{b_1}}$ in the 1T1R device $R_7^*$ of the 1T1R crossbar $A_2$ and storing it in the 1T1R device $R_{11}^*$ of the 1T1R crossbar $A_2$;

(S2-11) inputting logic signals $V_{WL8}^*=1$, $V_{WL11}^*=1$, $V_{WL0B}=1$, $V_{SL8}^*=V_0$, $V_{SL8}^*=V_0$, $V_{SL0B}=V_0$, and $V_{SL0B}=0$ to calculate a NOR value of data $\overline{a_0+b_0}$ and $\overline{a_1+b_1}$ 1T1R devices $R_8^*$ and $R_{11}^*$ of the 1T1R crossbar $A_2$ to obtain a first bit $$P_0 = s_0 = \overline{\overline{(a_0+b_0)} + \overline{(a_1+b_1)}}$$

of a two-bit multiplication result and storing it in the 1T1R device $R_{0B}$ of a 1T1R crossbar $A_3$;

(S2-12) inputting logic signals $V_{WL11}^*=1$, $V_{WL8}^*=1$, $V_{WL1B}=1$, $V_{SL11}^*=V_0$, $V_{SL8}^*=V_0$, and $V_{SL1B}=0$ to calculate a NOR value of data $\overline{\overline{a_1} + \overline{b_1}}$ and $\overline{a_0+b_0}$ in the 1T1R device $R_8^*$ and $R_{11}^*$ of the 1T1R crossbar $A_2$ to obtain a second bit $$P_1 = s_0 = \overline{\overline{(a_0+b_0)} + \overline{(a_1+b_1)}}$$

of the two-bit multiplication result and storing it in the 1T1R device $R_{1B}$ of the 1T1R crossbar $A_3$ respectively;

(S2-13) inputting logic signals $V_{WL5}^*=1$, $V_{WL10}^*=1$, $V_{WL13}^*=1$, $V_{SL5}^*=V_0$, $V_{SL10}^*=V_0$, and $V_{SL13}^*=0$ to calculate a NOR value $$s_{13}^* = \overline{\overline{(a_1+b_0)} + \overline{(a_0+b_1)}}$$

of data $\overline{\overline{a_0} + \overline{b_1}}$ and $\overline{a_1+b_0}$ in the 1T1R devices $R_5^*$ and $R_{10}^*$ of the 1T1R crossbar $A_2$ and storing it in the 1T1R device $R_{13}^*$ of the 1T1R crossbar $A_2$ respectively;

inputting logic signals $V_{WL6}^*=1$, $V_{WL9}^*=1$, $V_{WL14}^*=1$, $V_{SL6}^*=V_0$, $V_{SL9}^*=V_0$, and $V_{SL14}=0$ to calculate a NOR value $$s_{14}^* = \overline{\overline{(a_0+b_1)} + \overline{(a_1+b_0)}}$$

of data $\overline{\overline{a_1} + \overline{b_0}}$ and $\overline{a_0+b_1}$ in the 1T1R devices and $R_6^*$ and $R_9^*$ of the 1T1R crossbar $A_2$ and storing it in the 1T1R device $R_{14}^*$ of the 1T1R crossbar $A_2$ respectively; inputting logic signals $V_{WL15}=1$, $V_{WL12}=1$, $V_{WL2B}=1$, $V_{SL13}=V_0$, $V_{SL14}=V_0$, and $V_{SL15}=0$ to calculate a NOR value $$s_{15}^* = \overline{\overline{(a_0+b_1)} + \overline{(a_1+b_0)} + \overline{(a_1+b_0)} + \overline{(a_0+b_1)}}$$

of data $$s_{13}^* = \overline{\overline{(a_1+b_0)} + \overline{(a_0+b_1)}}$$

in the 1T1R devices $R_{13}^*$ and $R_{14}^*$ of the 1T1R crossbar $A_2$; inputting logic signals $V_{WL2A}=1$, $V_{WL12}^*=1$, $V_{WL15}^*=1$, $V_{SL2B}=0$, $V_{SL12}^*=V_0$, and $V_{SL15}^*=V_0$ to obtain a third bit $$P_2 = s_0 = \overline{\overline{(a_0+b_1)} + \overline{(a_1+b_0)} + \overline{(a_1+b_0)} + \overline{(a_0+b_1)}}$$

of the two-bit multiplication result and storing it in the 1T1R device $R_{2B}$ of the 1T1R crossbar $A_3$;

(S2-14) inputting logic signals $V_{WL3B}=1$, $V_{SL3B}=0$, and $V_{BL0}=1$ and setting the 1T1R device $R_{3B}$ of the 1T1R crossbar $A_3$ in low resistance, wherein the data $s_7^*$ in the 1T1R device $R_7^*$ of the 1T1R crossbar $A_2$ is a fourth bit of the two-bit multiplication result; inputting logic signals $V_{WL7}^*=V_{WL3B}=1$, $V_{SL7}^*=0$, and $V_{SL3B}=V_0$ so that the 1T1R device $R_1$ transfers the data $s_7^*$ to the 1T1R device $R_{3B}$ through a transfer operation to obtain a fourth bit $P_3=s_3$ of the two-bit multiplication result.

3. A multiplier based on a 1T1R memory configured to realize optimized two-bit binary multiplication and calculate product values $s_{0\sim3}$ according to input data $a_0a_1$ and $b_0b_1$, comprising: a 1T1R crossbar $A_1$, a 1T1R crossbar $A_2$, a 1T1R crossbar $A_3$, and a peripheral circuit;

the 1T1R crossbar $A_1$ comprises 2 1T1R devices $R_{0A}$ to $R_{1A}$ respectively configured to store initial input data $s_{0A\sim3A}=a_0a_1b_0b_1$ or calculation results $s_{0\sim1}$, word line control signals corresponding to $R_{0A}$ to $R_{3A}$ are $V_{WL0A}$ to $V_{WL1A}$, a bit line control signals corresponding to $R_{0A}$ to $R_{1A}$ is respectively $V_{BL0}$, and source line control signals corresponding to $R_{0A}$ to $R_{1A}$ are respectively $V_{SL0A}$ to $V_{SL1A}$;

the 1T1R crossbar $A_2$ comprises 8 1T1R devices $R_{0\sim7}^*$ respectively configured to store intermediate calculation results $s_{0\sim7}^*$, word line control signals corresponding to $R_{0\sim7}^*$ are $V_{WL0\sim7}^*$ a bit line control signal corresponding to $R_{0\sim7}^*$ is $V_{BL0}$, and source line control signals corresponding to $R_{0\sim7}^*$ are $V_{SL0\sim7}^*$;

the 1T1R crossbar $A_3$ comprises 2 1T1R devices $R_{0B}$ to $R_{1B}$ configured to calculate and store addition operation results $s_{2\sim3}$, word line control signals corresponding to $R_{0B}$ to $R_{1B}$ are $V_{WL0B}$ to $V_{WL1B}$, a bit line control signal corresponding to $R_{0B}$ to $R_{1B}$ is $V_{BL0}$, and source line control signals corresponding to $R_{0B}$ to $R_{1B}$ are $V_{SL0B}$ to $V_{SL1B}$;

the input signals are all controlled and applied by the peripheral circuit; the intermediate data $s_{0\sim7}^*$ and the calculation results $s_{0\sim3}$ obtained by calculating the 1T1R matrices $A_1$, $A_2$, and $A_3$ realize reading and outputting data through a data transfer controller in the peripheral circuit.

4. A computing method based on the multiplier of claim 3, comprising the following steps:

(S3-1) inputting logic signals $V_{WL0A}=1$, $V_{SL0A}=a_0$, and $V_{BL0}=\overline{a_0}$ and witting the operation data $a_0$ inputted into $R_{0A}$ of the 1T1R crossbar $A_1$, that is, $s_{0A}=a_0$; inputting logic signals $V_{WL1A}=1$, $V_{SL0A}=0$, and $V_{BL0}=1$ and setting $R_{1A}$ of the 1T1R crossbar $A_1$ in high resistance, that is, $s_{1A}=0$;

inputting logic signals $V_{WL0A}=1$, $V_{WL1A}=1$, $V_{WL0}^{*}=1$, $V_{SL0A}=V_0$, $V_{SL1A}=V_0$, and $V_{SL0}^{*}=0$ and obtaining a NOT value from data $s_{0A}=a_0$ and store it in the 1T1R device $R_{0A}$ of the 1T1R crossbar $A_1$ in $R_0^{*}$ of the 1T1R crossbar $A_2$, that is, $s_0^{*}=\overline{a_0}$;

(S3-2) inputting logic signals $V_{WL0A}=1$, $V_{SL0A}=a_1$, and $V_{BL0}=\overline{a_1}$ and writing the operation data $a_1$ inputted into $R_{0A}$ of the 1T1R crossbar $A_1$, that is, $s_{0A}=a_1$; inputting logic signals $V_{WL0A}=1$, $V_{WL1A}$, $V_{WL1}^{*}=1$, $V_{SL0A}=V_0$, $V_{SL1A}=V_0$, and $V^{SL1*}=0$ and obtaining a NOT value from data $s_{0A}=a_1$ and store it in the 1T1R device $R_{0A}$ of the 1T1R crossbar $A_1$ in $R_1^{*}$ of the 1T1R crossbar $A_2$, that is, $s_0^{*}=\overline{a_1}$;

(S3-3) inputting logic signals $V_{WL0A}=1$, $V_{SL0A}=0$, and $V_{BL0}=\overline{b_0}$ and writing the operation data $b_0$ inputted into $R_{0A}$ of the 1T1R crossbar $A_1$, that is, $s_{0A}=b_0$; inputting logic signals $V_{WL0A}=1$, $V_{WL1A}=1$, $V_{WL2}^{*}=1$, $V_{SL0A}=V_0$, $V_{SL1A}=V_0$, and $V_{SL2}^{*}=0$ and obtaining a NOT value from $s_{0A}=b_0$ and store it in the 1T1R device $R_{0A}$ of the 1T1R crossbar $A_1$ in $R_2^{*}$ of the 1T1R crossbar $A_2$, that is, $s_0^{*}=\overline{b_0}$;

(S3-4) inputting logic signals $V_{WL0A}=1$, $V_{SL0A}=1$, and $V_{BL0}=\overline{b_1}$ and writing the operation data $b_1$ inputted into $R_{0A}$ of the 1T1R crossbar $A_1$, that is, $s_{0A}=b_1$; inputting logic signals $V_{WL0A}=1$, $V_{WL1A}=1$, $V_{SL0A}=V_0$, $V_{SL1A}=V_0$, and $V_{SL3}^{*}=0$ and obtaining a NOT value from data $s_{0A}=b_1$ and store it in the 1T1R device $R_{0A}$ of the 1T1R crossbar $A_1$ in $R_3^{*}$ of the 1T1R crossbar $A_2$, that is, $s_0^{*}=\overline{b_1}$;

(S3-5) inputting logic signals $V_{WL0}^{*}=1$, $V_{WL2}^{*}=1$, $V_{WL4}^{*}=1$, $V_{SL0}^{*}=V_0$, $V_{SL2}^{*}=V_0$, and $V_{SL4}^{*}=0$ to calculate a NOR value $$s_4^{*} = \overline{\overline{a_0}+\overline{b_0}}$$

of $\overline{a_0}$ $\overline{b_0}$ in the 1T1R devices $R_0^{*}$ and $R_2^{*}$ of the 1T1R crossbar $A_2$ and storing it in a 1T1R device $R_4^{*}$ of the 1T1R crossbar $A_2$;

(S3-6) inputting logic signals $V_{WL0}^{*}=1$, $V_{WL3}^{*}=1$, $V_{WL4}^{*}=1$, $V_{SL0}^{*}=V_0$, $V_{SL3}^{*}=V_0$, and $V_{SL5}^{*}=0$ to calculate a NOR value $$s_5^{*} = \overline{\overline{a_0}+\overline{b_1}}$$

of $\overline{a_0}$ $\overline{b_1}$ in 1T1R the devices $R_0^{*}$ and $R_3^{*}$ of the 1T1R crossbar $A_2$ and storing it in a 1T1R device $R_5^{*}$ of the 1T1R crossbar $A_2$;

(S3-7) inputting logic signals $V_{WL1}^{*}=1$, $V_{WL2}^{*}=1$, $V_{WL0}^{*}=1$, $V_{SL1}^{*}=V_0$, $V_{SL2}^{*}=V_0$, and $V_{SL0}^{*}=0$ to calculate a NOR value $$s_0^{*} = \overline{\overline{a_1}+\overline{b_0}}$$

of $\overline{a_1}$ $\overline{b_1}$ in the 1T1R devices $R_1^{*}$ and $R_2^{*}$ of the 1T1R crossbar $A_2$ and storing it in the 1T1R device $R_0^{*}$ of the 1T1R crossbar $A_2$;

(S3-8) inputting logic signals $V_{WL1}^{*}=1$, $V_{WL3}^{*}=1$, $V_{WL2}^{*}=1$, $V_{SL1}^{*}=V_0$, $V_{SL3}^{*}=V_0$, and $V_{SL2}^{*}=0$ to calculate a NOR value $$s_2^{*} = \overline{\overline{a_1}+\overline{b_1}}$$

of $\overline{a_1}$ $\overline{b_1}$ in the 1T1R devices $R_1^{*}$ and $R_3^{*}$ of the 1T1R crossbar $A_2$ and storing it in the 1T1R device $R_2^{*}$ of the 1T1R crossbar $A_2$, which is a fourth bit $$P_3 = s_2^{*} = \overline{\overline{a_1}+\overline{b_1}}$$

of a two-bit binary multiplication result;

(S3-9) inputting logic signals $V_{WL0}^{*}=1$, $V_{WL1A}=0$, $V_{WL1}^{*}=1$, $V_{SL0}^{*}=V_0$, $V_{SL1A}=V_0$, and $V_{SL1}^{*}=0$ to calculate a NOT value $s_1^{*}=\overline{a_1+b_0}$ of $$\overline{\overline{a_1}+\overline{b_0}}$$

in the 1T1R device $R_1^{*}$ of the 1T1R crossbar $A_2$ and storing it in the 1T1R device $R_1^{*}$ of the 1T1R crossbar $A_2$;

(S3-10) inputting logic signals $V_{WL5}^{*}=1$, $V_{WL1A}=1$, $V_{WL3}^{*}=1$, $V_{SL5}^{*}=V_0$, $V_{SL1A}=V_0$, and $V_{SL3}^{*}=0$ to calculate a NOR values $s_3^{*}=\overline{a_0+b_1}$ of $$\overline{\overline{a_0}+\overline{b_1}}$$

in the 1T1R device $R_8^{*}$ of the 1T1R crossbar $A_2$ and storing it in the 1T1R device $R_3^{*}$ of the 1T1R crossbar $A_2$;

(S3-11) inputting logic signals $V_{WL5}^{*}=1$, $V_{WL1}^{*}=1$, $V_{WL0A}=1$, $V_{SL1}^{*}=V_0$, $V_{SL5}^{*}=V_0$, and $V_{SL0A}^{*}=0$ to calculate a NOR value $$s_0 = \overline{(\overline{a_1}+\overline{b_0})+(\overline{a_0}+\overline{b_1})}$$

of data $$\overline{\overline{a_0}+\overline{b_1}}$$

and $\overline{a_1}+\overline{b_0}$ in the 1T1R devices $R_5^{*}$ and $R_1^{*}$ of the 1T1R crossbar $A_2$ and storing it in a 1T1R device $R_0$ of the 1T1R crossbar $A_1$ respectively;

(S3-12) inputting logic signals $V_{WL0}{}^*=1$, $V_{WL3}{}^*=1$, $V_{WL1A}=1$, $V_{SL0}{}^*=V_0$, $V_{SL3}{}^*=V_0$, and $V_{SL1A}{}^*=0$ to calculate a NOR value $$s_1 = \overline{\overline{(\overline{a_0}+\overline{b_1})}+\overline{(\overline{a_1}+\overline{b_0})}}$$

of data $$\overline{\overline{a_1}+\overline{b_0}}$$

and
$\overline{\overline{a_0}+\overline{b_0}}$ in the 1T1R devices $R_0{}^*$ and $R_3{}^*$ of the 1T1R crossbar $A_2$ and storing it in a 1T1R device $R_1$ of the 1T1R crossbar $A_1$ respectively;

(S3-13) inputting logic signals $V_{WL0}{}^*=1$, $V_{SL0}{}^*=0$, and $V_{BL0}=1$ and setting $R_0{}^*$ of the 1T1R crossbar $A_2$ in high resistance, that is, $s_0{}^*=0$; inputting logic signals $V_{WL0A}=1$, $V_{WL1A}=1$, $V_{WL1}{}^*=1$, $V_{SL0A}=V_0$, $V_{SL1A}=V_0$, and $V_{SL1}{}^*=0$ to calculate a NOR value $$s_1^* = \overline{\overline{(\overline{a_0}+\overline{b_1})}+\overline{(\overline{a_1}+\overline{b_0})}+\overline{(\overline{a_1}+\overline{b_0})}+\overline{(\overline{a_0}+\overline{b_1})}}$$

of data $$s_0 = \overline{\overline{(\overline{a_1}+\overline{b_0})}+\overline{(\overline{a_0}+\overline{b_1})}}$$

and $$s_1 = \overline{\overline{(\overline{a_0}+\overline{b_1})}+\overline{(\overline{a_1}+\overline{b_0})}}$$

in the 1T1R devices $R_0$ and $R_1$ of the 1T1R crossbar $A_1$; inputting logic signals $V_{WL0A}=1$, $V_{WL0}{}^*=1$, $V_{WL1}{}^*=1$, $V_{SL0A}=V_0$, $V_{SL1}=V_0$, and $V_{SL0}{}^*=0$ to calculate a third bit $$P_2 = s_0 = \overline{\overline{(\overline{a_0}+\overline{b_1})}+\overline{(\overline{a_1}+\overline{b_0})}+\overline{(\overline{a_1}+\overline{b_0})}+\overline{(\overline{a_0}+\overline{b_1})}}$$

of a two-bit multiplication result and storing it in the 1T1R device $R_0$ of the 1T1R crossbar $A_1$ respectively;

(S3-14) inputting logic signals $V_{WL0}{}^*=1$, $V_{WL1}{}^*=1$, $V_{WL2}{}^*=1$, $V_{SL0}{}^*=V_0$, $V_{SL1}{}^*=0$, and $V_{SL2}{}^*=V_0$ to calculate a NOT value $s_1{}^*=\overline{a_1}+\overline{b_1}$ of $$\overline{\overline{a_1}+\overline{b_1}}$$

in the 1T1R device of $R_2{}^*$ of the 1T1R crossbar $A_2$ and storing it in the 1T1R device $R_1{}^*$ of the 1T1R crossbar $A_2$;

(S3-15) inputting logic signals $V_{WL0}{}^*=1$, $V_{WL3}{}^*=1$, $V_{WL4}{}^*=1$, $V_{SL0}=V_0$, $V_{SL3}{}^*=0$, and $V_{SL4}{}^*=V_0$ to calculate a NOT value $s_3{}^*=\overline{a_0}+\overline{b_0}$ of $$\overline{\overline{a_0}+\overline{b_0}}$$

in the 1T1R device $R_4{}^*$ of the 1T1R crossbar $A_2$ and storing it in the 1T1R device $R_3{}^*$ of the 1T1R crossbar $A_2$;

(S3-16) inputting logic signals $V_{WL1}{}^*=1$, $V_{WL3}{}^*=1$, $V_{WL1A}=1$, $V_{SL1}{}^*=V_0$, $V_{SL3}{}^*=0$, and $V_{SL1A}=V_0$ to obtain $$\overline{\overline{(\overline{a_1}+\overline{b_1})}+\overline{(\overline{a_0}+\overline{b_0})}}$$

of a first bit $P_0=s_1$ of the two-bit multiplication result in the 1T1R devices $R_1{}^*$ and $R_3{}^*$ of the 1T1R crossbar $A_2$ and storing it in the 1T1R device $R_1$ of the 1T1R crossbar $A_1$;

(S3-17) inputting logic signals $V_{WL0}{}^*=1$, $V_{WL2}{}^*=1$, $V_{WL3}{}^*=1$, $V_{SL0}{}^*=0$, $V_{SL2}{}^*=V_0$, and $V_{SL3}{}^*=V_0$ to obtain $$\overline{\overline{(\overline{a_1}+\overline{b_1})}+\overline{(\overline{a_0}+\overline{b_0})}}$$

of a second bit $P_1=s_1$ of the two-bit multiplication result in the 1T1R devices $R_2{}^*$ and $R_3{}^*$ of the 1T1R crossbar $A_2$ and storing it in the 1T1R device $R_0{}^*$ of the 1T1R crossbar $A_2$.

5. A multiplier based on a 1T1R memory, configured to realize a multiple parallel two-bit binary multiplier which calculates product value $s_{00}s_{10}s_{20}s_{30}$ to $s_{0(n-1)}s_{1(n-1)}s_{2(n-1)}s_{3(n-1)}$ according to input data $a_{00}a_{10}b_{00}b_{10}$ to $a_{0(n-1)}a_{1(n-1)}b_{0(n-1)}b_{1(n-1)}$, wherein n represents a number of module, and comprising: n 1T1R matrices $A_0$ to $A_{(n-1)}$, n 1T1R matrices $B_0$ to $B_{(n-1)}$, and n 1T1R matrices $C_0$ to $C_{(n-1)}$, and a peripheral circuit;

each of the n 1T1R matrices $A_0$ to $A_{(n-1)}$ includes 4 1T1R devices $R_{0A}$ to $R_{3A}$ respectively configured to store and calculate 4-bit initial input data $s_{0A\sim3A}$, word line control signals corresponding to $R_{0A}$ to $R_{3A}$ are $V_{WL0A}$ to $V_{WL3A}$, a bit line control signal corresponding to $R_{0A}$ to $R_{3A}$ is $V_{BL0x}$ respectively, and source line control signals corresponding to $R_{0A}$ to $R_{3A}$ are $V_{SL0A}$ to $V_{SL3A}$ respectively; each of the n 1T1R matrices $B_0$ to $B_{(n-1)}$ comprises 16 1T1R devices $R_{0\sim15}{}^*$ respectively configured to store intermediate calculation results $s_{0\sim15}{}^*$, word line control signals corresponding to $R_{0\sim15}{}^*$ are $V_{WL0\sim15}{}^*$, a bit line control signal corresponding to $R_{0\sim15}{}^*$ is $V_{BL0x}$, and source line control signals corresponding to $R_{0\sim15}{}^*$ are $V_{SL0\sim15}{}^*$; each of the n 1T1R matrices $C_0$ to $C_{(n-1)}$ comprises 4 1T1R devices $R_{0C}$ to $R_{3C}$ configured to calculate and store addition operation results $s_{0\sim3}$, word line control signals corresponding to $R_{0C}$ to $R_{3C}$ are $V_{WL0C}$ to $V_{WL3C}$, a bit line control signal corresponding to $R_{0C}$ to $R_{3C}$ is $V_{BL0x}$, and source line control signals corresponding to $R_{0C}$ to $R_{3C}$ are $V_{SL0C}$ to $V_{SL3C}$; the input signals are all controlled and applied by the peripheral circuit; intermediate data $s_{0x\sim15x}{}^*$ and calculation results $s_{0x\sim3x}$ obtained by calculating the 1T1R matrices A, B, and C realize reading and outputting data through a data transfer controller in the peripheral circuit, wherein x represents an x-th module; and at the same time, it is assured that bit lines of each of the modules are the same and bit lines of different modules are different.

6. An operation method based on the multiplier of claim 5, comprising the following steps:

(S4-1) inputting logic signals $V_{WL0Ax}=1$, $V_{SL0Ax}=a_{0x}$, and $V_{BL0}=\overline{a_{0x}}$ and writing the operation data $a_{0x}$ inputted into $R_{0Ax}$ of a 1T1R crossbar $A_1$; inputting logic signals $V_{WL1Ax}=1$, $V_{SL1Ax}=a_{1x}$, and $V_{BL0x}=\overline{a_{1x}}$ and writing the operation data $a_{1x}$ inputted into $R_{1Ax}$ of a 1T1R crossbar $A_x$; inputting logic signals $V_{WL2A}=1$, $V_{SL2A}=b_{0x}$, and $V_{BL0}=\overline{b_{0x}}$ and writing the operation data box inputted into $R_{2Ax}$ of the 1T1R crossbar $A_x$; inputting logic signals $V_{WL3Ax}=1$, $V_{SLAx}=b_{1x}$, and $V_{BL0}=\overline{b_{1x}}$ and writing the operation data $b_{1x}$ inputted into $R_{3Ax}$ of the 1T1R crossbar $A_x$;

(S4-2) inputting logic signals $V_{WL12x}=1$, $V_{SL12x}=0$, and $V_{BL0x}=1$ and setting a 1T1R device $R_{12x}^*$ in high resistance, that is, $s_{12x}^*=0$; inputting logic signals $V_{WL0Ax\sim3Ax}=1$, $V_{WL0x\sim3x}^*=1$, $V_{SL0Ax\sim3Ax}=V_0$, $V_{SL12x}^*=V_0$, $V_{SL0x\sim3x}^*=0$, and $V_{WL12x}^*=1$ respectively and calculating NOT value $s_{0x}^*=\overline{a_{0x}}$, $s_{1x}^*=\overline{a_{1x}}$, $s_{2x}^*=\overline{b_{0x}}$, $s_{3x}^*=\overline{b_{1x}}$ of an input data $a_{0x}a_{1x}b_{0x}b_{1x}$ and storing them in 1T1R device $R_{0x\sim3x}^*$ of a 1T1R crossbar $B_x$ respectively;

(S4-3) inputting logic signals $V_{WL0x}^*=1$, $V_{WL2x}^*=1$, $V_{WL4x}^*=1$, $V_{SL0x}^*=V_0$, $V_{SL2x}^*=V_0$, and $V_{SL4x}^*=0$ to calculate a NOR value $$s_{4x}^* = \overline{\overline{a_{0x}} + \overline{b_{0x}}}$$

in the 1T1R devices $R_{0x}^*$ and $R_{2x}^*$ of the 1T1R crossbar $B_x$ and storing it in a 1T1R device $R_{4x}^*$ of the 1T1R crossbar $B_x$;

(S4-4) inputting logic signals $V_{WL0x}^*=1$, $V_{WL3x}^*=1$, $V_{WL5x}^*=1$, $V_{SL1x}^*=V_0$, $V_{SL2x}^*=V_0$, and $V_{SL5x}^*=0$ to calculate a NOR value $$s_{5x}^* = \overline{\overline{a_{0x}} + \overline{b_{1x}}}$$

of $a_{0x}$ and $b_{1x}$ in the 1T1R devices $R_{0x}^*$ and $R_{3x}^*$ of the 1T1R crossbar $B_x$ and storing it in a 1T1R device $R_{5x}^*$ of the 1T1R crossbar $B_x$;

(S4-5) inputting logic signals $V_{WL1x}^*=1$, $V_{WL2x}^*=1$, $V_{WL6x}^*=1$, $V_{SL1x}^*=V_0$, $V_{SL2x}^*=V_0$, and $V_{SL6x}^*=0$ to calculate a NOR value $$s_{6x}^* = \overline{\overline{a_{1x}} + \overline{b_{0x}}}$$

of $\overline{a_{1x}}$ and $\overline{b_{0x}}$ in the 1T1R devices $R_{1x}^*$ and $R_{2x}^*$ of the 1T1R crossbar $B_x$ and storing it in a 1T1R device $R_{6x}^*$ of the 1T1R crossbar $B_x$;

(S4-6) inputting logic signals $V_{WL1x}^*=1$, $V_{WL3x}^*=1$, $V_{WL7x}^*=1$, $V_{SL1x}^*=V_0$, $V_{SL3x}^*=V_0$, and $V_{SL7x}^*=0$ to calculate a NOR value $$s_{7x}^* = \overline{\overline{a_{1x}} + \overline{b_{1x}}}$$

of $\overline{a_{1x}}$ and $\overline{b_{1x}}$ in the 1T1R devices $R_{1x}^*$ and $R_{3x}^*$ of the 1T1R crossbar $B_x$ and storing it in a 1T1R device $R_{7x}^*$ of the 1T1R crossbar $B_x$;

(S4-7) inputting logic signals $V_{WL4x}^*=1$, $V_{WL0Bx}=1$, $V_{WL8x}^*=1$, $V_{WSL4x}^*=V_0$, $V_{SL0Bx}=V_0$ and $V_{SL8x}^*=0$ to calculate a NOT value $s_{8x}^*=\overline{\overline{a_{0x}}+\overline{b_{0x}}}$ of data $$\overline{\overline{a_{0x}} + \overline{b_{0x}}}$$

in the 1T1R device $R_{4x}^*$ of the 1T1R crossbar $B_x$ and storing it in a 1T1R device $R_{8x}^*$ of the 1T1R crossbar $B_x$;

(S4-8) inputting logic signals $V_{WL5x}^*=1$, $V_{WL0Bx}=1$, $V_{WL9x}^*=1$, $V_{WSL5x}^*=V_0$, $V_{SL0Bx}=V_0$ and $V_{SL9x}^*=0$ to calculate a NOT value $s_{9x}^*=\overline{\overline{a_{0x}}+\overline{b_{1x}}}$ of data $$\overline{\overline{a_{0x}} + \overline{b_{1x}}}$$

in the 1T1R device $R_{5x}^*$ of the 1T1R crossbar $B_x$ and storing it in a 1T1R device $R_{9x}^*$ of the 1T1R crossbar $B_x$;

(S4-9) inputting logic signals $V_{WL6x}^*=1$, $V_{WL0Bx}=1$, $V_{WL10x}^*=1$, $V_{WSL6x}^*=V_0$, $V_{SL0Bx}=V_0$ and $V_{SL10x}^*=0$ to calculate a NOT value $s_{10x}^*=\overline{\overline{a_{1x}}+\overline{b_{0x}}}$ of data $$\overline{\overline{a_{1x}} + \overline{b_{0x}}}$$

in the 1T1R device $R_{6x}^*$ of the 1T1R crossbar $B_x$ and storing it in a 1T1R device $R_{10x}^*$ of the 1T1R crossbar $B_x$;

(S4-10) inputting logic signals $V_{WL7x}^*=1$, $V_{WL0Bx}=1$, $V_{WL11x}^*=1$, $V_{WSL7x}^*=V_0$, $V_{SL0Bx}=V_0$ and $V_{SL11x}^*=0$ to calculate a NOT value $s_{11x}^*=\overline{\overline{a_{1x}}+\overline{b_{1x}}}$ of data $$\overline{\overline{a_{1x}} + \overline{b_{1x}}}$$

in the 1T1R device $R_{7x}^*$ of the 1T1R crossbar $B_x$ and storing it in a 1T1R device $R_{11x}^*$ of the 1T1R crossbar $B_x$;

(S4-11) inputting logic signals $V_{WL8x}^*=1$, $V_{WL11x}^*=1$, $V_{WL0Bx}=1$, $V_{WSL8x}^*=V_0$, $V_{SL11x}^*=0$, and $V_{SL0Bx}=V_0$ to calculate a NOR value of data $\overline{\overline{a_{0x}}+\overline{b_{0x}}}$ and $\overline{\overline{a_{1x}}+\overline{b_{1x}}}$ in the 1T1R devices $R_{8x}^*$ and $R_{11x}^*$ of the 1T1R crossbar $B_x$ to obtain a first bit $$P_{0x} = s_{0x} = \overline{(\overline{\overline{a_{0x}} + \overline{b_{0x}}}) + (\overline{\overline{a_{1x}} + \overline{b_{1x}}})}$$

of a two-bit multiplication result and storing it in a 1T1R device $R_{0Bx}$ of a 1T1R crossbar $C_x$;

(S4-12) inputting logic signals $V_{WL11x}^*=1$, $V_{WL8x}^*=1$, $V_{WL1Bx}=1$, $V_{WSL11x}^*=V_0$, $V_{SL8x}^*=0$, and $V_{SL1Bx}=V_0$ to calculate a NOR value of data $$\overline{\overline{a_{1x}} + \overline{b_{1x}}}$$

and $\overline{\overline{a_{0x}}+\overline{b_{0x}}}$ in the 1T1R devices $R_{8x}^*$ and $R_{11x}^*$ of the 1T1R crossbar $B_x$ to obtain a second bit $$P_{1x} = s_{0x} = \overline{(\overline{\overline{a_{0x}} + \overline{b_{0x}}}) + (\overline{\overline{a_{1x}} + \overline{b_{1x}}})}$$

of a two-bit multiplication result and storing it in a 1T1R device $R_{1Bx}$ of a 1T1R crossbar $C_x$ respectively;

(S4-13) inputting logic signals $V_{WL5x}^*=1$, $V_{WL10x}^*=1$, $V_{WL13x}^*=1$, $V_{SL7x}^*=V_0$, $V_{SL8x}^*=V_0$, and $V_{SL13x}^*=0$ to calculate a NOR value $$s_{13}^* = \overline{\overline{(a_{1x}+b_{0x})} + \overline{(a_{0x}+b_{1x})}}$$

of data $$\overline{a_{0x}+b_{1x}}$$

and $\overline{a_{1x}+b_{0x}}$ in the 1T1R devices $R_{5x}^*$ and $R_{10x}^*$ of the 1T1R crossbar $B_x$ and storing it in a 1T1R device $R_{13x}^*$ of the 1T1R crossbar $B_x$ respectively;

inputting logic signals $V_{WL6x}^*=1$, $V_{WL9x}^*=1$, $V_{WL14x}^*=1$, $V_{SL6x}^*=V_0$, $V_{SL9x}^*=V_0$, and $V_{SL14x}^*=0$ to calculate a NOR value $$s_{14x}^* = \overline{\overline{(a_{0x}+b_{1x})} + \overline{(a_{1x}+b_{0x})}}$$

of data $$\overline{a_{1x}+b_{0x}}$$

and $\overline{a_{0x}+b_{1x}}$ in the 1T1R devices $R_{6x}^*$ and $R_{9x}^*$ of the 1T1R crossbar $B_x$ and storing it in a 1T1R device $R_{14x}^*$ of the 1T1R crossbar $B_x$ respectively; inputting logic signals $V_{WL15x}^*=1$, $V_{WL12x}^*=1$, $V_{WL2Bx}^*=1$, $V_{SL13x}^*=V_0$, $V_{SL14x}^*=V_0$, and $V_{SL15x}^*=0$ to calculate a NOR value $$s_{15x}^* = \overline{\overline{(a_{0x}+b_{1x})} + \overline{(a_{1x}+b_{0x})} + \overline{(a_{1x}+b_{0x})} + \overline{(a_{0x}+b_{1x})}}$$

of data $$s_{13x}^* = \overline{\overline{(a_{1x}+b_{0x})} + \overline{(a_{0x}+b_{1x})}}$$

$$s_{14x}^* = \overline{\overline{(a_{0x}+b_{1x})} + \overline{(a_{1x}+b_{0x})}}$$

in the 1T1R devices $R_{13x}^*$ and $R_{14x}^*$ of the 1T1R crossbar $B_x$; inputting logic signals $V_{WL2A}=1$, $V_{WL12x}^*=1$, $V_{WL15x}^*=1$, $V_{SL2Bx}=0$, $V_{SL12x}^*=V_0$, and $V_{SL15x}^*=V_0$ to obtain a third bit $$P_{x2} = s_{0x} = \overline{\overline{(a_{0x}+b_{1x})} + \overline{(a_{1x}+b_{0x})} + \overline{(a_{1x}+b_{0x})} + \overline{(a_{0x}+b_{1x})}}$$

of the two-bit multiplication result and storing it in a 1T1R device $R_{2Bx}$ of the 1T1R crossbar $C_x$;

(S4-14) inputting logic signals $V_{WL3Bx}=1$, $V_{SL3Bx}=0$, and $V_{BL0x}=1$ and setting a 1T1R device $R_{3Bx}$ of the 1T1R crossbar $C_x$ in low resistance, wherein the data $s_{7x}^*$ in the 1T1R device $R_{7x}^*$ of the 1T1R crossbar $B_x$ is a fourth bit of the two-bit multiplication result; inputting logic signals $V_{WL7x}^*=V_{WL3Bx}=1$, $V_{SL7x}^*=0$, and $V_{SL3Bx}=V_0$ so that the 1T1R device $R_{7x}^*$ transfers the data $s_{7x}^*$ to the 1T1R device $R_{3Bx}$ through a transfer operation to obtain a fourth bit $P_{3x}=s_{3x}$ of the two-bit multiplication result.

7. The multiplier of claim 1, wherein the peripheral circuit comprises: a data transfer controller, a word line decoder, a source line decoder, a bit line decoder, a word line multiplexer, a bit line multiplexer, a source line multiplexer, and a timer controller;

the data transfer controller is formed by a data register, a data reading circuit, a data writing circuit, and a unit addressing circuit, and the data transfer controller has a data registration terminal $D_{in}$, an output terminal $D_{out}$, an address input terminal Address, a word line output terminal, a bit line output terminal, and a source line output terminal; the input terminal $D_{in}$ of the data transfer controller is configured to input a calculation data, the output terminal $D_{out}$ is configured to output a calculation result, the address input terminal Address of a state controller is configured to input an address information of a selected specific device, and the word line output terminal, the bit line output terminal, and the source line output terminal are configured to output address signals of word line, bit line, and source line and read and write signals generated by read and write circuits; the data transfer controller generates a control signal and output it to a next stage or read a final calculation result according to data inputted and outputted, and the address information request;

an input terminal of the word line decoder is connected to a word line output terminal of the data transfer controller, and an output terminal of the word line decoder is connected to a word line multiplexer input terminal; after the word line decoder decodes a control signal generated by the state controller, a word line control signal is obtained, and the word line control signal is inputted to the word line multiplexer input terminal;

an input terminal of the bit line decoder is connected to a bit line output terminal of the data transfer controller, and an output terminal of the bit line decoder is connected to a bit line multiplexer input terminal; after the bit line decoder decodes a control signal generated by the state controller, a bit line control signal is obtained, and the bit line control signal is inputted to the word line multiplexer input terminal;

an input terminal of the source line decoder is connected to a source line output terminal of the data transfer controller, and an output terminal of the source line decoder is connected to a source line multiplexer input terminal; after the source line decoder decodes a control signal generated by the state controller, a source line control signal is obtained, and the source line control signal is inputted to the word line multiplexer input terminal;

an output terminal of the word line multiplexer is connected to a word line of the 1T1R crossbar, and the word line multiplexer applies the word line control signal to a gated specific word line according to a signal of the word line decoder;

an output terminal of the bit line multiplexer is connected to a bit line of a 1T1R crossbar, and the bit line multiplexer applies the bit line control signal to a gated specific bit line according to a signal of the bit line decoder;

an output terminal of the source line multiplexer is connected to a source line of the 1T1R crossbar, and the source line multiplexer applies the source line control signal to a gated specific source line according to a signal of the source line decoder;

the word line control signal, the bit line control signal, and the source line control signal are applied to the 1T1R crossbar in common to achieve a control of a resistance state of a 1T1R device in the 1T1R crossbar;

an output terminal of the timing controller is connected to the word line, bit line, and source line multiplexers, and the timing controller generates a clock signal and an enable signal to control operation of the circuit.

8. The multiplier of claim 7, wherein the data registration terminal $D_{in}$, the output terminal $D_{out}$, the address input terminal Address, a clock signal input terminal clk signal, and an enable signal input terminal enable signal of the data transfer controller are respectively used as a data registration output terminal, an address input terminal, a clock signal input terminal, and an enable signal input terminal of a calculation matrix.

9. The multiplier of claim 3, wherein the peripheral circuit comprises: a data transfer controller, a word line decoder, a source line decoder, a bit line decoder, a word line multiplexer, a bit line multiplexer, a source line multiplexer, and a timing control device;

the data transfer controller is formed by a data register, a data reading circuit, a data writing circuit, and a unit addressing circuit, and the data transfer controller has a data registration terminal $D_{in}$, an output terminal $D_{out}$, an address input terminal Address, a word line output terminal, a bit line output terminal, and a source line output terminal; the input terminal $D_{in}$ of the data transfer controller is configured to input a calculation data, the output terminal $D_{out}$ is configured to output a calculation result, the address input terminal Address of a state controller is configured to input an address information of a selected specific device, and the word line output terminal, the bit line output terminal, and the source line output terminal are configured to input address signals of word line, bit line, and source line and read and write signals generated by read and write circuits; the data transfer controller generates a control signal and output it to a next stage or read a final calculation result according to data inputted and outputted, and the address information request;

an input terminal of the word line decoder is connected to a word line output terminal of the data transfer controller, and an output terminal of the word line decoder is connected to a word line multiplexer input terminal; after the word line decoder decodes a control signal generated by the state controller, a word line control signal is obtained, and the word line control signal is inputted to the word line multiplexer input terminal;

an input terminal of the bit line decoder is connected to a bit line output terminal of the data transfer controller, and an output terminal of the bit line decoder is connected to a bit line multiplexer input terminal; after the bit line decoder decodes a control signal generated by the state controller, a bit line control signal is obtained, and the bit line control signal is inputted to the word line multiplexer input terminal;

an input terminal of the source line decoder is connected to a source line output terminal of the data transfer controller, and an output terminal of the source line decoder is connected to a source line multiplexer input terminal; after the source line decoder decodes a control signal generated by the state controller, a source line control signal is obtained, and the source line control signal is inputted to the word line multiplexer input terminal;

an output terminal of the word line multiplexer is connected to a word line of the 1T1R crossbar, and the word line multiplexer applies the word line control signal to a gated specific word line according to a signal of the word line decoder;

an output terminal of the bit line multiplexer is connected to a bit line of a 1T1R crossbar, and the bit line multiplexer applies the bit line control signal to a gated specific bit line according to a signal of the bit line decoder;

an output terminal of the source line multiplexer is connected to a source line of the 1T1R crossbar, and the source line multiplexer applies the source line control signal to a gated specific source line according to a signal of the source line decoder;

the word line control signal, the bit line control signal, and the source line control signal are applied to the 1T1R crossbar in common to achieve a control of a resistance state of a 1T1R device in the 1T1R crossbar;

an output terminal of the timing controller is connected to the word line, bit line, and source line multiplexers, and the timing controller generates a clock signal and an enable signal to control operation of the circuit.

10. The multiplier of claim 9, wherein the data registration terminal $D_{in}$, the output terminal $D_{out}$, the address input terminal Address, a clock signal input terminal clk signal, and an enable signal input terminal enable signal of the data transfer controller are respectively used as a data registration output terminal, an address input terminal, a clock signal input terminal, and an enable signal input terminal of a calculation matrix.

11. The multiplier of claim 5, wherein the peripheral circuit comprises: a data transfer controller, a word line decoder, a source line decoder, a bit line decoder, a word line multiplexer, a bit line multiplexer, a source line multiplexer, and a timing control device;

the data transfer controller is formed by a data register, a data reading circuit, a data writing circuit, and a unit addressing circuit, and the data transfer controller has a data registration terminal $D_{in}$, an output terminal $D_{out}$, an address input terminal Address, a word line output terminal, a bit line output terminal, and a source line output terminal; the input terminal $D_{in}$ of the data transfer controller is configured to input a calculation data, the output terminal $D_{out}$ is configured to output a calculation result, the address input terminal Address of a state controller is configured to input an address information of a selected specific device, and the word line output terminal, the bit line output terminal, and the source line output terminal are configured to input address signals of word line, bit line, and source line and read and write signals generated by read and write circuits; the data transfer controller generates a control signal and output it to a next stage or read a final calculation result according to data inputted and outputted, and the address information request;

an input terminal of the word line decoder is connected to a word line output terminal of the data transfer controller, and an output terminal of the word line decoder is connected to a word line multiplexer input terminal; after the word line decoder decodes a control signal generated by the state controller, a word line control signal is obtained, and the word line control signal is inputted to the word line multiplexer input terminal;

an input terminal of the bit line decoder is connected to a bit line output terminal of the data transfer controller, and an output terminal of the bit line decoder is connected to a bit line multiplexer input terminal; after the bit line decoder decodes a control signal generated by the state controller, a bit line control signal is obtained, and the bit line control signal is inputted to the word line multiplexer input terminal;

an input terminal of the source line decoder is connected to a source line output terminal of the data transfer controller, and an output terminal of the source line decoder is connected to a source line multiplexer input terminal; after the source line decoder decodes a control signal generated by the state controller, a source line control signal is obtained, and the source line control signal is inputted to the word line multiplexer input terminal;

an output terminal of the word line multiplexer is connected to a word line of the 1T1R crossbar, and the word line multiplexer applies the word line control signal to a gated specific word line according to a signal of the word line decoder;

an output terminal of the bit line multiplexer is connected to a bit line of a 1T1R crossbar, and the bit line multiplexer applies the bit line control signal to a gated specific bit line according to a signal of the bit line decoder;

an output terminal of the source line multiplexer is connected to a source line of the 1T1R crossbar, and the source line multiplexer applies the source line control signal to a gated specific source line according to a signal of the source line decoder;

the word line control signal, the bit line control signal, and the source line control signal are applied to the 1T1R crossbar in common to achieve a control of a resistance state of a 1T1R device in the 1T1R crossbar;

an output terminal of the timing controller is connected to the word line, bit line, and source line multiplexers, and the timing controller generates a clock signal and an enable signal to control operation of the circuit.

12. The multiplier of claim 11, wherein the data registration terminal $D_{in}$, the output terminal $D_{out}$, the address input terminal Address, a clock signal input terminal clk signal, and an enable signal input terminal enable signal of the data transfer controller are respectively used as a data registration output terminal, an address input terminal, a clock signal input terminal, and an enable signal input terminal of a calculation matrix.

* * * * *